(12) United States Patent
Chen et al.

(10) Patent No.: US 11,626,444 B2
(45) Date of Patent: Apr. 11, 2023

(54) IMAGE SENSORS WITH DUMMY PIXEL STRUCTURES

(71) Applicant: Taiwan Semiconductor Manufacturing Co., Ltd., Hsinchu (TW)

(72) Inventors: Yu-Wei Chen, Hsinchu (TW); Chung-Chuan Tseng, Hsinchu (TW); Chiao-Chi Wang, Hsinchu (TW); Chia-Ping Lai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 161 days.

(21) Appl. No.: 17/004,284

(22) Filed: Aug. 27, 2020

(65) Prior Publication Data

US 2021/0272988 A1  Sep. 2, 2021

Related U.S. Application Data

(60) Provisional application No. 62/982,457, filed on Feb. 27, 2020.

(51) Int. Cl.
*H01L 27/146* (2006.01)

(52) U.S. Cl.
CPC .... *H01L 27/1464* (2013.01); *H01L 27/14603* (2013.01); *H01L 27/14605* (2013.01); *H01L 27/14683* (2013.01); *H01L 27/14627* (2013.01); *H01L 27/14636* (2013.01)

(58) Field of Classification Search
CPC .................. H01L 27/14603; H01L 27/14605
See application file for complete search history.

(56) References Cited

U.S. PATENT DOCUMENTS

| | | | |
|---|---|---|---|
| 10,319,765 B2 | 6/2019 | Kato et al. | |
| 10,515,988 B2 | 12/2019 | Tayanaka et al. | |
| 10,804,304 B2 | 10/2020 | Noh et al. | |
| 2018/0019280 A1 | 1/2018 | Lee et al. | |

(Continued)

FOREIGN PATENT DOCUMENTS

| | | |
|---|---|---|
| CN | 107431075 A | 12/2017 |
| CN | 107564925 A | 1/2018 |

(Continued)

*Primary Examiner* — David A Zarneke
(74) *Attorney, Agent, or Firm* — Sterne, Kessler, Goldstein & Fox P.L.L.C.

(57) ABSTRACT

A semiconductor device with dummy and active pixel structures and a method of fabricating the same are disclosed. The semiconductor device includes a first pixel region with a first pixel structure, a second pixel region, surrounding the first pixel region, includes a second pixel structure adjacent to the first pixel structure and electrically isolated from the first pixel structure, and a contact pad region with a pad structure disposed adjacent to the second pixel region. The first pixel structure includes a first epitaxial structure disposed within a substrate and a first capping layer disposed on the first epitaxial structure. The second pixel structure includes a second epitaxial structure disposed within the substrate and a second capping layer disposed on the second epitaxial structure. Top surfaces of the first and second epitaxial structures are substantially coplanar with each other. The first and second epitaxial structures includes a same semiconductor material.

20 Claims, 26 Drawing Sheets

(56) References Cited

U.S. PATENT DOCUMENTS

| | | |
|---|---|---|
| 2018/0197904 A1 | 7/2018 | Oh et al. |
| 2019/0081099 A1 | 3/2019 | Tamaki et al. |
| 2019/0088700 A1 | 3/2019 | Yang |

FOREIGN PATENT DOCUMENTS

| | | |
|---|---|---|
| CN | 110034139 A | 7/2019 |
| KR | 1020100078218 A | 7/2010 |
| KR | 1020180007493 A | 1/2018 |
| KR | 1020180082811 A | 7/2018 |

IMAGE SENSORS WITH DUMMY PIXEL STRUCTURES

CROSS-REFERENCE TO RELATED APPLICATIONS

This application claims the benefit of U.S. Provisional Patent Application No. 62/982,457 titled "Dummy Structures for Chemical Mechanical Polishing Control in Semiconductor Manufacturing Processes," filed Feb. 27, 2020, the disclosure of which is incorporated by reference herein in its entirety.

BACKGROUND

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. An example of an image sensor is a backside illuminated (BSI) image sensor, which detects radiation from a "backside" of a substrate of the BSI image sensor.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
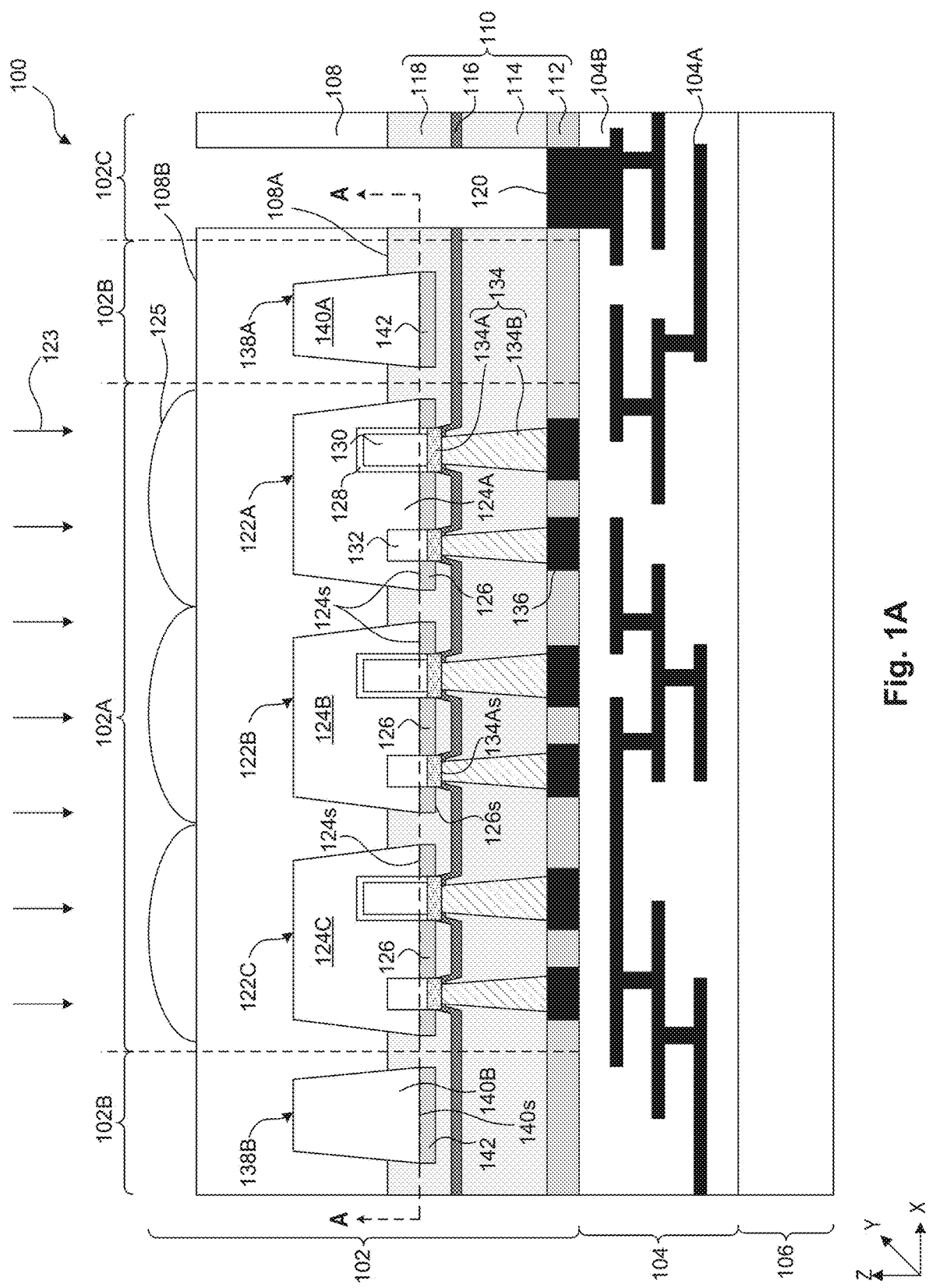
FIG. 1A illustrates a cross-sectional view of a BSI image sensor with active pixel structures and dummy pixel structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "removal selectivity" refers to the ratio of the removal rates of two different materials under the same removal conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

As used herein, the term "electrically inactive structure" refers to a structure that is not electrically coupled to a power supply.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

A BSI image sensor (e.g., time-of-flight sensor) includes an active pixel region (also referred to as radiation-sensing region") with an array of active pixel structures formed on a substrate (e.g., a semiconductor substrate). The active pixel structures are configured to receive a radiation (e.g., infra-red radiation) reflected from an object and convert photons from the received radiation to electrical signal. The electrical signal is used to produce a depth image by measuring the phase-delay of the received radiation. The electrical signal is subsequently distributed to processing components attached to the BSI image sensor. For this reason, the active pixel structures overlie a multi-level metallization layer configured to distribute the electrical signal generated within the active pixel structures to appropriate processing components.

The multi-level metallization layer is coupled to a first surface of the substrate, which is also referred to as the "front side" surface of the substrate. The active pixel structures are formed on the front side surface of the substrate and the radiation is received by the active pixel structures through a second surface of the substrate that is opposite to the front side surface of the substrate. This second surface of the substrate is also referred to as the "back side" surface of the substrate. Each of the active pixel structures includes a germanium (Ge) or silicon germanium (SiGe) epitaxial structure disposed within the substrate, a silicon capping layer disposed on the Ge or SiGe epitaxial structure, and doped regions disposed within the Ge or SiGe epitaxial structure and the silicon capping layer. The silicon capping layers passivate the Ge or SiGe epitaxial structures and provide silicon atoms for the formation of silicide structures on the doped regions.

The BSI image sensor can be electrically coupled to external devices (e.g., an external circuitry) through wire connectors attached to pad structures formed on the back side surface of the substrate. To achieve this, the pad structures of the BSI image sensor extend from the back side surface of the substrate to the front side surface of the substrate and electrically connect to the multi-level metallization layer. Accordingly, the multilevel metallization layer, which provides electrical signal connection to the BSI image sensor can be electrically connected to an external device or circuit through the pad structures. The pad structures can be disposed at the periphery of the BSI image sensor around the active pixel region.

A challenge with BSI image sensors is reducing or eliminating dark current, which is induced by surface non-uniformity of the Ge or SiGe epitaxial structures formed on the front side surface of the substrate. The dark current is an electrical current that passes through the Ge or SiGe epitaxial structures even when no photons are received by the BSI image sensors. The dark current generation source is the non-uniform interfaces between the Ge or SiGe epitaxial structures and the silicon capping layers that induce charge carriers (e.g., holes) to accumulate at the non-uniform interfaces. Such dark currents cause the Ge or SiGe epitaxial structures to generate electrical signals that do not correspond to the actual amount of the radiation received by the BSI image sensors. As a result, the dark currents degrade the performance of the BSI image sensors in accurately determining the distance of the object from the BSI image sensor.

The surface non-uniformity, such as recesses are formed near the edges of the outermost Ge or SiGe epitaxial structures in the array of active pixel structures as a result of "dishing" caused by the chemical mechanical polishing (CMP) processes used in the formation of the Ge or SiGe epitaxial structures. The dishing effect is due to the different polishing rates of the outermost Ge or SiGe epitaxial structures and the adjacent oxide layer disposed around the outermost Ge or SiGe epitaxial structures.

The present disclosure provides example BSI image sensors with dummy and active pixel structures and example methods for fabricating the same. In some embodiments, the dummy pixel structures are disposed in a dummy pixel region surrounding an array of active pixel structures. The dummy and active pixel structures include similar epitaxial structures (also referred to as "dummy epitaxial structures" and "active epitaxial structures") and are formed at the same time. The placement of the dummy epitaxial structures adjacent to the outermost active epitaxial structures and the formation of the epitaxial structures at the same time eliminates or minimizes the CMP process-related dishing effect in the outermost active epitaxial structures.

In some embodiments, the dummy epitaxial structures are arranged to cover about 10% to about 100% (e.g., about 20%, about 50%, about 80%, or about 100%) of the dummy pixel region surrounding the outermost active epitaxial structures to adequately planarize the active epitaxial structures with minimal CMP process-related dishing effects (e.g., zero dishing effects). In some embodiments, the dummy epitaxial structures have top surface areas that are about 50% to about 120% of the top surface areas of the outermost active epitaxial structures for minimal CMP process-related dishing effects. Thus, the dummy pixel structures minimizes or eliminates surface non-uniformity, such as recesses near the edges of the outermost active epitaxial structures, and consequently reduces or eliminates the formation of non-uniform interfaces between the active epitaxial structures and silicon capping layers. In some embodiments, the surface non-uniformity in the active epitaxial structures is reduced by about 50% to about 100% compared to active epitaxial structures in BSI image sensors without the dummy pixel structures described here. As a result, the sensor performance of the BSI image sensors with the dummy pixel structures is increased by about 40% to about 60% compared to BSI image sensors without the dummy pixel structures described herein.

A semiconductor device 100 having a BSI image sensor 102, a multi-level metallization layer 104, and a carrier substrate 106 is described with reference to FIGS. 1A-1F, according to some embodiments. FIG. 1A illustrates a cross-sectional view of semiconductor device 100, according to some embodiments. Semiconductor device 100 can have different cross-sectional views along line A-A and XY-plane of BSI image sensor 102 of FIG. 1A as illustrated in FIGS. 1B-1F, according to various embodiments. The discussion of elements in FIGS. 1A-1F with the same annotations applies to each other, unless mentioned otherwise.

Referring to FIG. 1A, BSI image sensor 102 can be disposed on and electrically coupled to a multi-level metallization layer 104. Multi-level metallization layer 104 can be disposed on a carrier substrate 106 and can include a multi-level interconnect structure 104A embedded in an inter-metal dielectric (IMD) layer 104B. Carrier substrate 106 can be bonded to multi-level metallization layer 104 by molecular forces—a technique known as direct bonding or optical fusion bonding—or by other bonding techniques, such as metal diffusion or anodic bonding. In some embodiments, carrier substrate 106 can include a semiconductor material, such as Si, Ge, SiGe, silicon carbide (SiC), indium phosphide (InP), gallium arsenide (GaAs), and a combination thereof. Other suitable materials for carrier substrate 106 are within the scope of the present disclosure. In some embodiments, carrier substrate 106 can include an application specific integrated circuit (ASIC) (not shown). The ASIC can include active devices (e.g., transistor structures) to form logic and memory circuits in the ASIC. Electrical connections between the active devices of the ASIC and BSI image sensor 102 are provided by multi-level metallization layer 104.

BSI image sensor 102 can be formed on a substrate 108 with a front side surface 108A and a back side surface 108B. Substrate 108 can be a semiconductor material, such as Si, Ge, SiGe, silicon carbide (SiC), indium phosphide (InP), gallium arsenide (GaAs), and a combination thereof. In some embodiments, substrate 108 can include a silicon-on-insulator (SOI) structure or a germanium-on-insulator (GOI) structure. Other suitable materials for substrate 108 are within the scope of the present disclosure.

Figure 1B:
FIGS. 1B-1F illustrate cross-sectional views of active pixel regions and dummy pixel regions of BSI image sensors, in accordance with some embodiments.

Referring to FIG. 1A, BSI image sensor 102 can include a stack of layers 110 disposed between front side surface 108A and multi-level metallization layer 104. In some embodiments, stack of layers 110 can include (i) a passivation layer 112 disposed on multi-level metallization layer 104, (ii) an interlayer dielectric (ILD) layer 114 disposed on passivation layer 112, (iii) an etch stop layer (ESL) 116 disposed on ILD layer 114, and (iv) a dielectric layer 118 disposed on ESL 116. Referring to FIGS. 1A-1B, BSI image sensor 102 can further include an active pixel region 102A, a dummy pixel region 102B surrounding active pixel region 102A, and a contact pad region 102C, according to some embodiments. Dummy pixel region 102B is the region between dotted line 103 and active pixel region 102A, as illustrated in FIGS. 1B-1F.

Contact pad region 102C can include a pad structure 120 and one or more conductive bonding pads or solder bumps (not shown) on pad structure 120 through which electrical connections between BSI image sensor 102 and external circuit can be established. Pad structure 120 is an input/output (I/O) port of BSI image sensor 102 and includes a conductive layer that is electrically coupled to a multi-level interconnect structure 104A.

In some embodiments, active pixel region 102A can include an array of active pixel structures 122A-122I. Though an array of nine active pixel structures 122A-122I are shown, BSI image sensor 102 can have any number of active pixel structures. Active pixel structures 122A-122I are configured to receive incident radiation beams 123 through microlens 125 on back side surface 108B and convert them to an electrical signal. The electrical signal is distributed by pad structure 120 and multi-level metallization layer 104 to carrier substrate 106 and/or an external circuit.

In some embodiments, BSI image sensor 102 can be a time-of-flight sensor configured to determine the distance of an object from BSI image sensor 102 based on the known speed of light. For example, a light pulse generator (not shown) disposed on or near the BSI image sensor can project a light pulse (e.g., near infra-red radiation) on the object and the light pulse reflected by the object can be detected by active pixel structures 122A-122I. Based on the time difference between the projection time of the light pulse and the detection time of the reflected light pulse, the distance of the object from BSI image sensor 102 can be determined.

Active pixel structures 122A-122I are electrically isolated from each other by dielectric layer 118 and are protected by passivation layer 112, ILD layer 114, and ESL 116 during fabrication of BSI image sensor 102. In some embodiments, dielectric layer 118 can include a nitride layer, an oxide layer, an oxynitride layer, or a suitable dielectric material. In some embodiments, passivation layer 112 can include a nitride layer, an oxide layer, an oxynitride layer, a polymer layer, or a combination thereof. In some embodiments, ILD layer 114 can include a low-k dielectric layer (e.g., a dielectric with a dielectric constant less than about 3.9), an ultra-low-k dielectric layer (e.g., a dielectric with a dielectric constant less than about 2.5), or an oxide layer (e.g., silicon oxide ($SiO_x$)). In some embodiments, ESL 116 can include a nitride layer, an oxide layer, an oxynitride layer, a carbide layer, or a suitable dielectric material.

In some embodiments, active pixel structures 122A-122I can include (i) active epitaxial structures 124A-124I disposed within substrate 108 and dielectric layer 118, (ii) capping layers 126 disposed on active epitaxial structure 124A-124I and embedded within dielectric layer 118, (iii) N-well regions 128 disposed within active epitaxial structure 124A-124I and capping layers 126, (iv) P-type doped regions 130 disposed within N-well regions 128, (v) N-type doped regions 132 disposed within active epitaxial structure 124A-124I and capping layers 126, (vi) contact structures 134 disposed on P- and N-type doped regions 130-132, and (vii) via structures 136 disposed on contact structures 134.

Active epitaxial structures 124A-124I are formed on front side surface 108A and can include a group IV element (e.g., Si, Ge, etc.) of the periodic table. In some embodiments, active epitaxial structures 124A-124I can include undoped Ge or SiGe. In some embodiments, capping layers 126 can include a group IV element (e.g., Si) of the periodic table that is different from the element included in active epitaxial structures 124A-124I. The element included in capping layers 126 can have a band gap different from the band gap of the element included in active epitaxial structures 124A-124I, which results in band discontinuity between active epitaxial structures 124A-124I and corresponding capping layers 126 (e.g., a difference between the minimum conduction band energy and/or the maximum valence band energy of active epitaxial structures 124A-124I and capping layers 126).

Contact structures 134 can be configured to electrically connect active epitaxial structures 124A-124I to multi-level metallization layer 104 through via structures 136. Each of contact structures 134 can include a silicide layer 134A and a contact plug 134B. Silicide layers 134A are disposed on P- and N-type doped regions 130-132 and within capping layers 126. Surfaces 134As of silicide layers 134A can be substantially coplanar (not shown) with surfaces 126s of capping layers 126 or can extend below surfaces 126s of capping layers 126, as shown in FIG. 1A. In some embodiments, silicide layers 134A can include nickel silicide (NiSi), tungsten silicide ($WSi_2$), titanium silicide ($TiSi_2$), cobalt silicide ($CoSi_2$), or a suitable metal silicide. Contact plugs 134B are disposed on silicide layers 134A and within ILD layer 114. In some embodiments, contact plugs 134B can include conductive materials, such as ruthenium (Ru), iridium (Ir), nickel (Ni), Osmium (Os), rhodium (Rh), aluminum (Al), molybdenum (Mo), tungsten (W), cobalt (Co), and copper (Cu). Via structures 136 are disposed on contact plugs 134B and within passivation layer 112. In some embodiments, via structures 136 can include conductive materials, such as Ru, Co, Ni, Al, Mo, W, Ir, Os, Cu, and Pt.

Referring to FIGS. 1A-1B, dummy pixel region 102B with dummy pixel structures 138A-138L surrounds active pixel region 102A with the array of active pixel structures 122A-122I. Dummy pixel region 102B may not include other structures besides dummy pixel structures 138A-138L, as shown in FIG. 1B. Dummy pixel structures 138A-138L are electrically inactive structures and are electrically isolated from active pixel structures 122A-122I and other structures of semiconductor device 100. In some embodiments, dummy pixel structures 138A-138L can include (i) dummy epitaxial structures 140A-140L disposed within substrate 108 and dielectric layer 118, and (ii) dummy capping layers 142 disposed on dummy epitaxial structures 140A-140L and embedded within dielectric layer 118. Dummy epitaxial structures 140A-140L include top surfaces 140s (i.e., surfaces facing dummy capping layers 142) substantially coplanar with top surfaces 124s (i.e., surfaces facing capping layers 126) of active epitaxial structures 124A-124I, as shown in FIGS. 1A-1B. Dummy epitaxial structures 140A-140L include material similar to the material included in active epitaxial structures 124A-124I and are formed on front side surface 108A at the same time as active epitaxial structures 124A-124I. Similarly, dummy capping layers 142 include material similar to the material included in capping layers 126 and are formed at the same time as capping layers 126. Dummy epitaxial structures 140A-140L and active epitaxial structures 124A-124I have vertical dimensions (e.g., height) along a Z-axis similar to each other.

The placement of dummy epitaxial structures 140A-140L adjacent to the outermost active epitaxial structures 124A-124D and 124F-124I eliminates or minimizes the CMP process-related dishing effect on the outermost active epitaxial structures 124A-124D and 124F-124I. In the absence of dummy epitaxial structures 140A-140L, the CMP process-related dishing effect can create concave shaped recesses with recess depths greater than about 30 nm on top surfaces 124s of the outermost active epitaxial structures 124A-124D and 124F-124I. The CMP process-related dishing effect can occur in the absence of dummy epitaxial structures 140A-140L due to different polishing rates of the different materials of the outermost active epitaxial structures 124A-124D and 124F-124I and the regions of dielectric layer 118 surrounding the outermost active epitaxial structures 124A-124D and 124F-124I.

The use of dummy epitaxial structures 140A-140L improves the uniformity of top surfaces 124s by about 50% to about 100% compared to top surfaces of active epitaxial structures 124A-124D and 124F-124I that are not surrounded by dummy epitaxial structures. In some embodiments, top surfaces 124s can have a surface roughness less than about 10 nm (e.g., about 2 nm, about 5 nm, or about 8 nm) and can have concave shaped recesses (not shown) with recess depths less than about 5 nm (e.g., 0.1 nm, 0.5 nm, 1 nm, or 2 nm). In some embodiments, top surfaces 124s can have a substantially uniform surface without any concave shaped recesses, as shown in FIG. 1A. The improved uniformity of top surfaces 124s consequently improves the interfaces between the outermost active epitaxial structures 124A-124D and 124F-124I and corresponding capping layers 126. As a result, the generation of dark currents due to non-uniform interfaces between the outermost active epitaxial structures 124A-124D and 124F-124I and corresponding capping layers 126 is minimized or eliminated, and consequently, the sensor performance of BSI image sensor 102 is improved.

In some embodiments, for adequate planarization of top surfaces 124s with minimal non-uniformity (e.g., no recess on top surfaces 124s), dummy epitaxial structures 140A-140L are arranged in a configuration such that each side of the outermost active epitaxial structures 124A-124D and 124F-124I facing dummy pixel region 102A is adjacent to one of dummy epitaxial structures 140A-140L, as shown in FIG. 1B. In addition, arrays of dummy epitaxial structures along an X-axis (e.g., dummy epitaxial structures 140G-140L) are spaced apart from the respective outermost active epitaxial structures 124A-124C and 124G-124I by a distance D1. Arrays of dummy epitaxial structures along an Y-axis (e.g., dummy epitaxial structures 140A-140F) are spaced apart from the respective outermost active epitaxial structures 124A, 124D, 124G, 124C, 124F, and 124I by a distance D2, which can be equal to or different from distance D1. Distances D1-D2 can range from about 200 nm to about 1000 nm. If distances D1-D2 are less than 100 nm, dummy epitaxial structures 140A-140L may merge with the outermost active epitaxial structures 124A-124D and 124F-124I during the fabrication process (e.g., during epitaxial growth process). On the other, if distances D1-D2 are greater than 1000 nm, the device area of BSI image sensor 102 increases, and consequently increases the manufacturing cost.

In some embodiments, top surfaces 140s of dummy epitaxial structures 140A-140L have a total surface area of about 10% to about 90% of the horizontal surface area (e.g., along an XY plane) of dummy pixel region 102B. In some embodiments, for adequate planarization of top surfaces 124s with minimal non-uniformity, dummy epitaxial structures 140A-140L are arranged in a configuration such that ratios between the surface areas of adjacent top surfaces 124s and 140s ranges from about 2:1 to about 1:2 (e.g., about 2:1, about 1.8:1, about 1.6:1, about 1.5:1, about 1.2:1, about 1:1, about 1:1.2, about 1:1.5, or about 1:2). In addition, ratios between the lengths of sides of top surfaces 124s and 140s facing each other ranges from about 2:1 to about 1:2 (e.g., about 2:1, about 1.8:1, about 1.6:1, about 1.5:1, about 1.2:1, about 1:1, about 1:1.2, about 1:1.5, or about 1:2).

For example, referring to FIG. 1B, top surface 124s of active epitaxial structure 124A can have a surface area $SA_{124A}$ (not shown) and sides S1-S2 and top surfaces 140s of dummy epitaxial structures 140A and 140G adjacent to active epitaxial structure 124A can have surface areas $SA_{140A}$, and $SA_{140G}$ (not shown) and sides $S_{140A}$ and $S_{140G}$. For adequate planarization of top surface 124s of active epitaxial structure 124A, surface area ratios $SA_{124A}:SA_{140A}$ and/or $SA_{124A}:SA_{140G}$ ranges from about 2:1 to about 1:2 (e.g., about 2:1, about 1.8:1, about 1.6:1, about 1.5:1, about 1.2:1, about 1:1, about 1:1.2, about 1:1.5, or about 1:2). In addition, ratios between lengths (e.g., along an X-axis) of sides S1 and $S_{140G}$ and/or between lengths (e.g., along a Y-axis) of sides S2 and $S_{140A}$ facing each other ranges from about 2:1 to about 1:2 (e.g., about 2:1, about 1.8:1, about 1.6:1, about 1.5:1, about 1.2:1, about 1:1, about 1:1.2, about 1:1.5, or about 1:2).

In some embodiments, a ratio between the total surface area of top surfaces 124s of the outermost active epitaxial structures 124A-124D and 124F-124I and the total surface area of top surfaces 140s ranges from about 2:1 to about 1:2 (e.g., about 2:1, about 1.8:1, about 1.6:1, about 1.5:1, about 1.2:1, about 1:1, about 1:1.2, about 1:1.5, or about 1:2). In some embodiments, dummy epitaxial structures 140A-140L can have dimensions similar to or different from each other. In some embodiments, active epitaxial structures 124A-124I can have dimensions similar to each other. The above discussed dimensions of dummy epitaxial structures 140A-140L with respect to active epitaxial structures 124A-124I provide substantially uniform top surfaces 124s without the CMP process-related dishing effect. The use of dummy epitaxial structures 140A-140L with dimensions outside the above discussed dimensions may not adequately planarize top surfaces 124s and/or increase the manufacturing cost of BSI image sensor 102.

In some embodiments, dummy pixel region 102B can additionally include dummy pixel structures 139A-139D disposed at the corner regions of dummy pixel region 102B, as shown in FIG. 1B. Similar to dummy pixel structures 138A-138L, dummy pixel structures 139A-139D are electrically inactive structures and are electrically isolated from active pixel structures 122A-122I and other structures of semiconductor device 100. Dummy pixel structures 139A-139D can include (i) dummy epitaxial structures 141A-141D disposed within substrate 108 and dielectric layer 118, and (ii) dummy capping layers 142 disposed on dummy epitaxial structures 141A-141D and embedded within dielectric layer 118. The discussion of dummy pixel structures 138A-138L applies to dummy pixel structures 139A-139D, unless mentioned otherwise.

In some embodiments, for adequate planarization of top surfaces 124s with minimal non-uniformity (e.g., no recess on top surfaces 124s), dummy epitaxial structures 141A-141D are disposed at the corner regions of dummy pixel region 102B when top surfaces 140s of dummy epitaxial structures 140A-140L have a total surface area of about 10% to about 50% of the horizontal surface area (e.g., along an XY plane) of dummy pixel region 102B. Each of dummy epitaxial structures 141A-141D can have a top surface area about 10% to about 50% of the surface area of one of top surfaces 124s. If top surfaces 140s of dummy epitaxial structures 140A-140L have a total surface area greater than about 50% (e.g., about 51% to about 90%) of the horizontal surface area (e.g., along an XY plane) of dummy pixel region 102B, dummy pixel structures 139A-139D can be absent from dummy pixel region 102B, according to some embodiments.

In some embodiments, for adequate planarization of top surfaces 124s, dummy epitaxial structures 141A-141D are disposed at the corner regions of dummy pixel region 102B when the surface area of top surface 140s of each dummy epitaxial structures 140A-140B, 140E-140F, 140G, 140I, 140J, and 140L (i.e., dummy epitaxial structures adjacent to the corner regions) is about 50% to about 100% of the surface area of adjacent top surfaces 124s. If the surface area of top surface 140s is greater than 100% (e.g., about 110% to about 150%) of the surface area of adjacent top surfaces 124s, dummy pixel structures 139A-139D can be absent from dummy pixel region 102B, according to some embodiments.

Figure 1C:
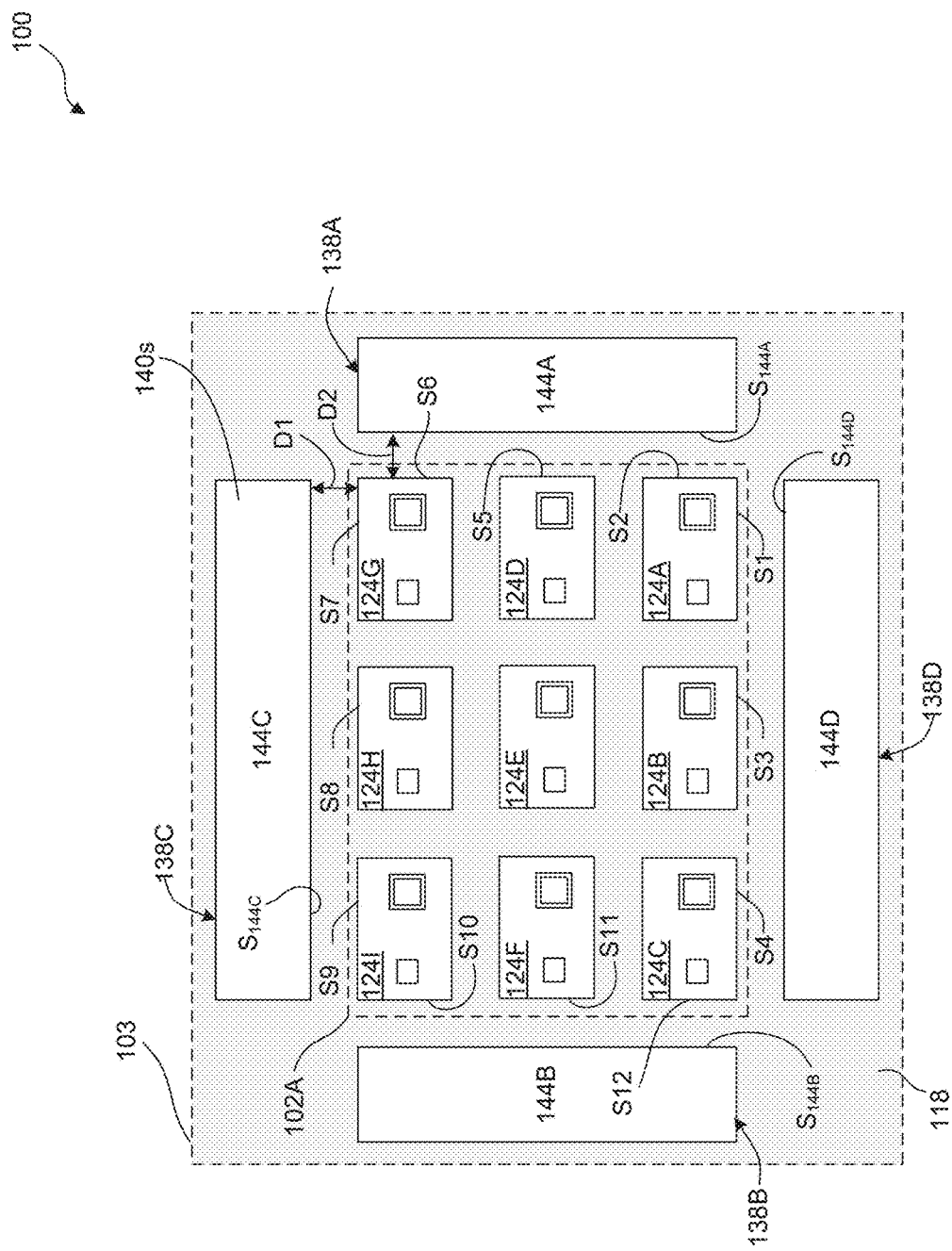

Referring to FIGS. 1A-1B and 1C, dummy pixel region 102B can have dummy pixel structures 138A-138D surrounding the array of active pixel structures 122A-122I, instead of dummy pixel structures 138A-138L. Dummy pixel region 102B may not include other structures besides dummy pixel structures 138A-138D, as shown in FIG. 1C. In some embodiments, dummy pixel structures 138A-138D can include (i) dummy epitaxial structures 144A-144D disposed within substrate 108 and dielectric layer 118, and (ii) dummy capping layers 142 disposed on dummy epitaxial structures 144A-144D and embedded within dielectric layer 118. The discussion of dummy epitaxial structures 140A-140L applies to dummy epitaxial structures 144A-144D, unless mentioned otherwise. The cross-sectional view of dummy epitaxial structures 140A-140B in FIG. 1A applies to dummy epitaxial structures 144A-144B.

Dummy epitaxial structures 144A-144D include top surfaces 140s substantially coplanar with top surfaces 124s of active epitaxial structures 124A-124I. Top surfaces 140s of dummy epitaxial structures 144A-144D can have surface areas $SA_{144A}$-$SA_{144D}$ and sides $S_{144A}$-$S_{144D}$. In some embodiments, dummy epitaxial structures 144A-144D can have dimensions similar to or different from each other. Top surfaces 124s of active epitaxial structure 124A-124I can have surface areas $SA_{124A}$-$SA_{124I}$ and sides S1-S12.

In some embodiments, for adequate planarization of top surfaces 124s with minimal non-uniformity, dummy epitaxial structures 144A-144D are arranged in a configuration such that each side (e.g., sides S1-S12) of the outermost active epitaxial structures 124A-124D and 124F-124I facing dummy pixel region 102B is adjacent to one of dummy epitaxial structures 144A-144D, as shown in FIG. 1C. In addition, dummy epitaxial structures 144C-144D are spaced apart from the respective outermost active epitaxial structures 124A-124C and 124G-124I by a distance D1 and dummy epitaxial structures 144A-144B are spaced apart from the respective outermost active epitaxial structures 124A, 124D, 124G, 124C, 124F, and 124I by a distance D2, which is equal to or different from distance D1. Distances D1-D2 can range from about 200 nm to about 1000 nm.

In some embodiments, for adequate planarization of top surfaces 124s with minimal non-uniformity, a ratio between the total top surface area of an outermost row or column of active epitaxial structures 124A-124I and the top surface area of one of dummy epitaxial structures 144A-144D that is adjacent to the outermost row or column ranges from about 2:1 to about 1:2 (e.g., about 2:1, about 1.8:1, about 1.6:1, about 1.5:1, about 1.2:1, about 1:1, about 1:1.2, about 1:1.5, or about 1:2). For example, surface area ratios $(SA_{124A}+SA_{124B}+SA_{124C}):SA_{144D}$, $(SA_{124A}+SA_{124D}+SA_{124G}):SA_{144A}$, $(SA_{124C}+SA_{124F}+SA_{124I}):SA_{144B}$, and/or $(SA_{124G}+SA_{124H}+SA_{124I}):SA_{144C}$ ranges from about 2:1 to about 1:2 (e.g., about 2:1, about 1.8:1, about 1.6:1, about 1.5:1, about 1.2:1, about 1:1, about 1:1.2, about 1:1.5, or about 1:2). In addition, side length ratios $(S1+S3+S4):S_{144D}$, $(S2+S5+S6):S_{144A}$, $(S7+S8+S9):SA_{144C}$, and/or $(S10+S11+S12):SA_{144B}$ ranges from about 2:1 to about 1:2 (e.g., about 2:1, about 1.8:1, about 1.6:1, about 1.5:1, about 1.2:1, about 1:1, about 1:1.2, about 1:1.5, or about 1:2).

In some embodiments, similar to FIG. 1B, dummy pixel region 102B of FIG. 1C can have dummy pixel structures 139A-139D disposed at the corner regions (not shown in FIG. 1C). Dummy epitaxial structures 141A-141D are disposed at the corner regions of dummy pixel region 102B of FIG. 1C when top surfaces 140s of dummy epitaxial structures 144A-144D have a total surface area of about 10% to about 70% of the horizontal surface area (e.g., along an XY plane) of dummy pixel region 102B. If top surfaces 140s of dummy epitaxial structures 144A-144D have a total surface area greater than about 70% (e.g., about 71% to about 90%) of the horizontal surface area (e.g., along an XY plane) of dummy pixel region 102B, dummy pixel structures 139A-139D can be absent from dummy pixel region 102B of FIG. 1C, according to some embodiments.

Figure 1D:
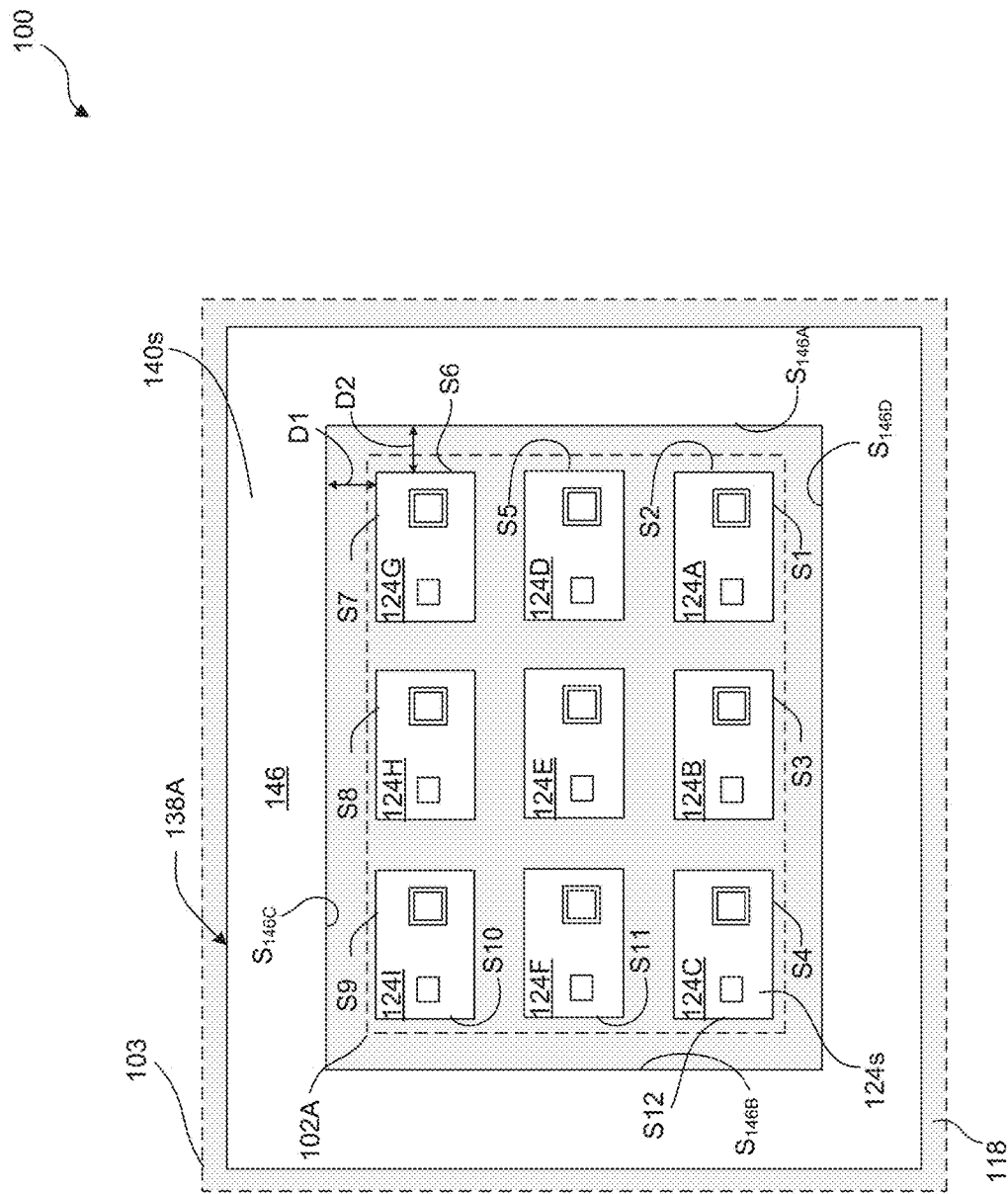

Referring to FIGS. 1A-1B and 1D, dummy pixel region 102B can have a dummy pixel structure 138A surrounding the array of active pixel structures 122A-122I, instead of dummy pixel structures 138A-138L. Dummy pixel region 102B may not include other structures besides dummy pixel structure 138A, as shown in FIG. 1D. In some embodiments, dummy pixel structure 138A can include (i) dummy epitaxial structure 146 disposed within substrate 108 and dielectric layer 118, and (ii) dummy capping layer 142 disposed on dummy epitaxial structure 146 and embedded within dielectric layer 118. The discussion of dummy epitaxial structures 140A-140L applies to dummy epitaxial structure 146, unless mentioned otherwise. The cross-sectional view of dummy epitaxial structures 140A-140B in FIG. 1A applies to dummy epitaxial structure 146.

Dummy epitaxial structure 146 includes a top surface 140s substantially coplanar with top surfaces 124s of active epitaxial structures 124A-124I. In some embodiments, for adequate planarization of top surfaces 124s with minimal non-uniformity, sides $S_{146C}$-$S_{146D}$ of dummy epitaxial structure 146 are spaced apart from the respective outermost active epitaxial structures 124A-124C and 124G-124I by a distance D1 and sides $S_{146A}$-$S_{146B}$ of dummy epitaxial structure 146 are spaced apart from the respective outermost active epitaxial structures 124A, 124D, 124G, 124C, 124F, and 124I by a distance D2, which is equal to or different from distance D1. Distances D1-D2 can range from about 200 nm to about 1000 nm.

In some embodiments, for adequate planarization of top surfaces 124s with minimal non-uniformity, a ratio between the total top surface area of the outermost active epitaxial structures 124A-124D and 124F-124I and the top surface area of dummy epitaxial structure 146 ranges from about 2:1 to about 1:2 (e.g., about 2:1, about 1.8:1, about 1.6:1, about 1.5:1, about 1.2:1, about 1:1, about 1:1.2, about 1:1.5, or about 1:2). In addition, side length ratios (S1+S3+S4):$S_{146D}$, (S2+S5+S6):$S_{146A}$, (S7+S8+S9):$SA_{146C}$, and/or (S10+S11+S12):$SA_{146B}$ ranges from about 2:1 to about 1:2 (e.g., about 2:1, about 1.8:1, about 1.6:1, about 1.5:1, about 1.2:1, about 1:1, about 1:1.2, about 1:1.5, or about 1:2).

Figure 1E:
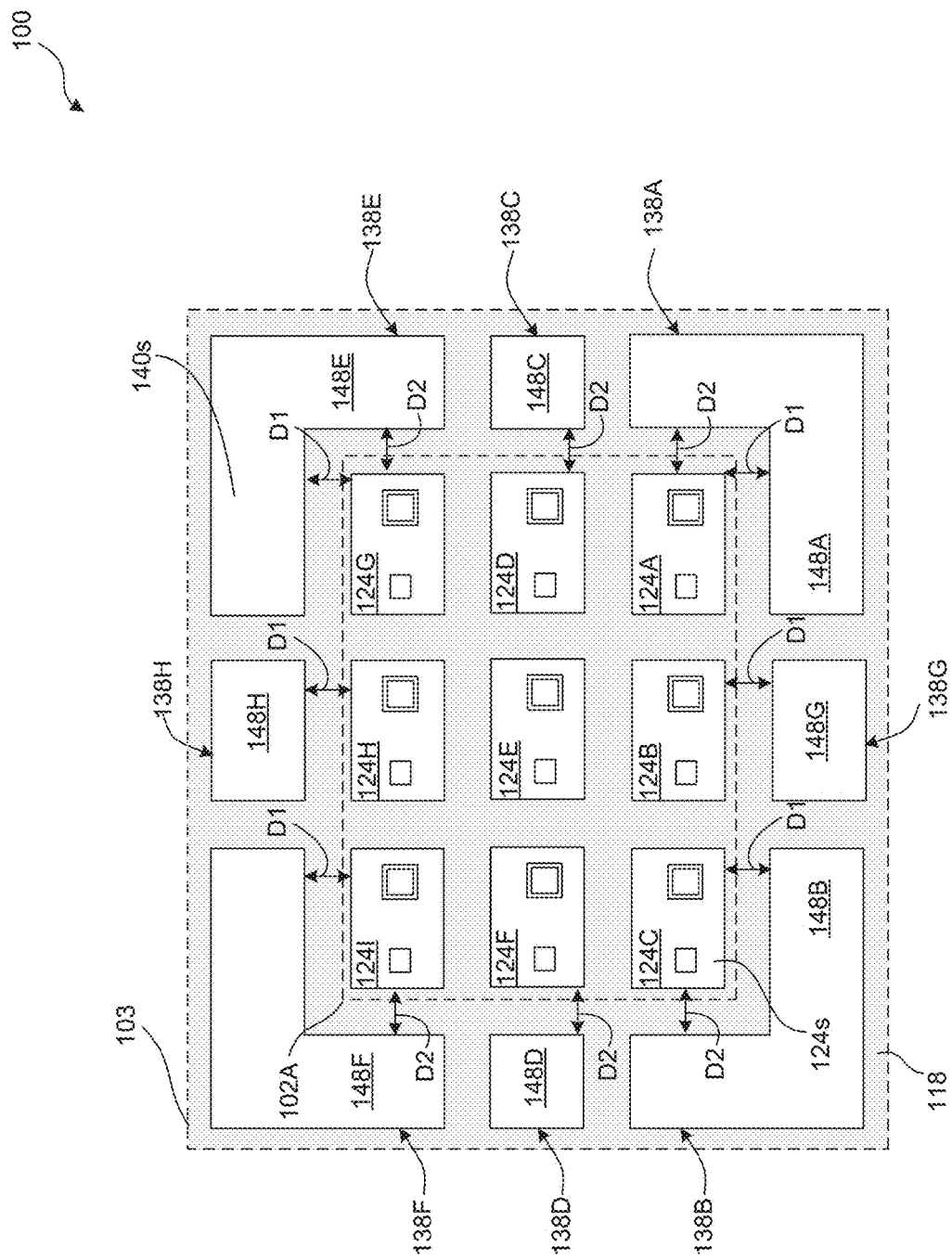

Referring to FIGS. 1A-1B and 1E, dummy pixel region 102B can have dummy pixel structures 138A-138H surrounding the array of active pixel structures 122A-122I, instead of dummy pixel structures 138A-138L. Dummy pixel region 102B may not include other structures besides dummy pixel structures 138A-138H, as shown in FIG. 1E. In some embodiments, dummy pixel structures 138A-138H can include (i) dummy epitaxial structures 148A-148H disposed within substrate 108 and dielectric layer 118, and (ii) dummy capping layers 142 disposed on dummy epitaxial structures 148A-148H and embedded within dielectric layer 118. The discussion of dummy epitaxial structures 140A-140L applies to dummy epitaxial structures 148A-148H, unless mentioned otherwise. The cross-sectional view of dummy epitaxial structures 140A-140B in FIG. 1A applies to dummy epitaxial structures 148A-148B.

Dummy epitaxial structures 148A-148H include top surfaces 140s substantially coplanar with top surfaces 124s of active epitaxial structures 124A-124I. In some embodiments, for adequate planarization of top surfaces 124s with minimal non-uniformity, dummy epitaxial structures 148A-148H are spaced apart from the outermost active epitaxial structures 124A-124D and 124F-124I by distances D1-D2, as shown in FIG. 1E. Distances D1-D2 can be equal to or different from each other and can range from about 200 nm to about 1000 nm. In some embodiments, for adequate planarization of top surfaces 124s with minimal non-uniformity, dummy epitaxial structures 148A-148H are arranged in a configuration such that ratios between the surface areas of adjacent top surfaces 124s and 140s ranges from about 2:1 to about 1:2 (e.g., about 2:1, about 1.8:1, about 1.6:1, about 1.5:1, about 1.2:1, about 1:1, about 1:1.2, about 1:1.5, or about 1:2).

Figure 1F:
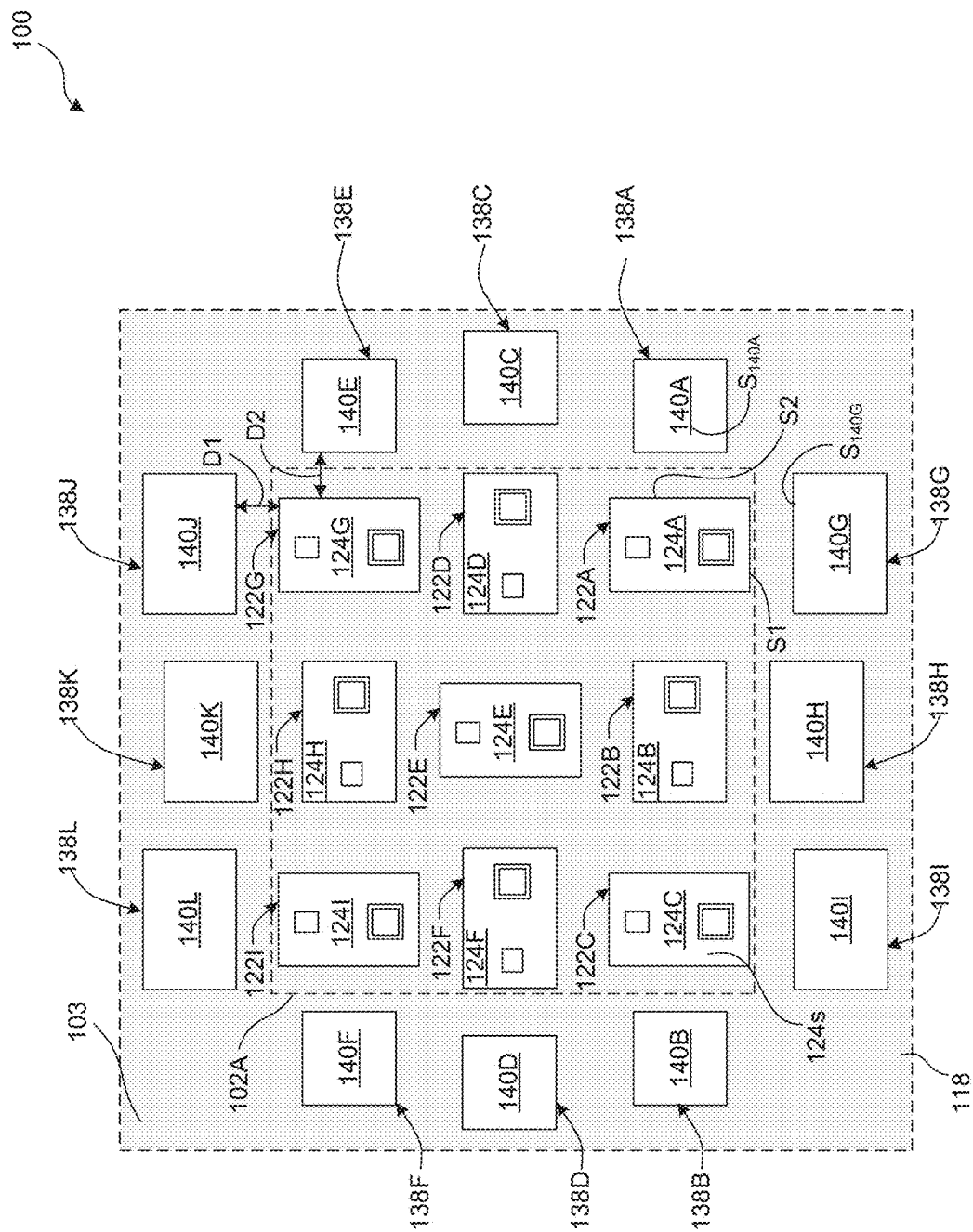

In some embodiments, BSI image sensor 102 can have an active pixel region 102A with the array configuration shown in FIG. 1F instead of the array configuration in active pixel region 102A of FIG. 1B. The discussion of elements of FIG. 1B applies to the elements of FIG. 1F, unless mentioned otherwise. In FIG. 1F, adjacent active pixel structures in the array of active pixel structures 122A-122I are not aligned to each other with respect to their sides, unlike the active pixel structures 122A-122I of FIG. 1B. In some embodiments, for adequate planarization of top surfaces 124s with minimal non-uniformity, dummy epitaxial structures 140A-140L are spaced apart from the outermost active epitaxial structures 124A-124D and 124F-124I by distances D1-D2 in a manner similar to that described above with reference to FIG. 1B. Distances D1-D2 can be equal to or different from each other and can range from about 200 nm to about 1000 nm. In some embodiments, instead of dummy pixel structures 138A-138L, dummy pixel region 102B of FIG. 1F can have dummy pixel structures 138A-138D of FIG. 1C, dummy pixel structure 138A of FIG. 1D, or dummy pixel structures 138A-138H of FIG. 1E. In some embodiments, similar to FIG. 1B, dummy pixel region 102B of FIG. 1F can have dummy pixel structures 139A-139D disposed at the corner regions (not shown in FIG. 1F).

Figure 2:
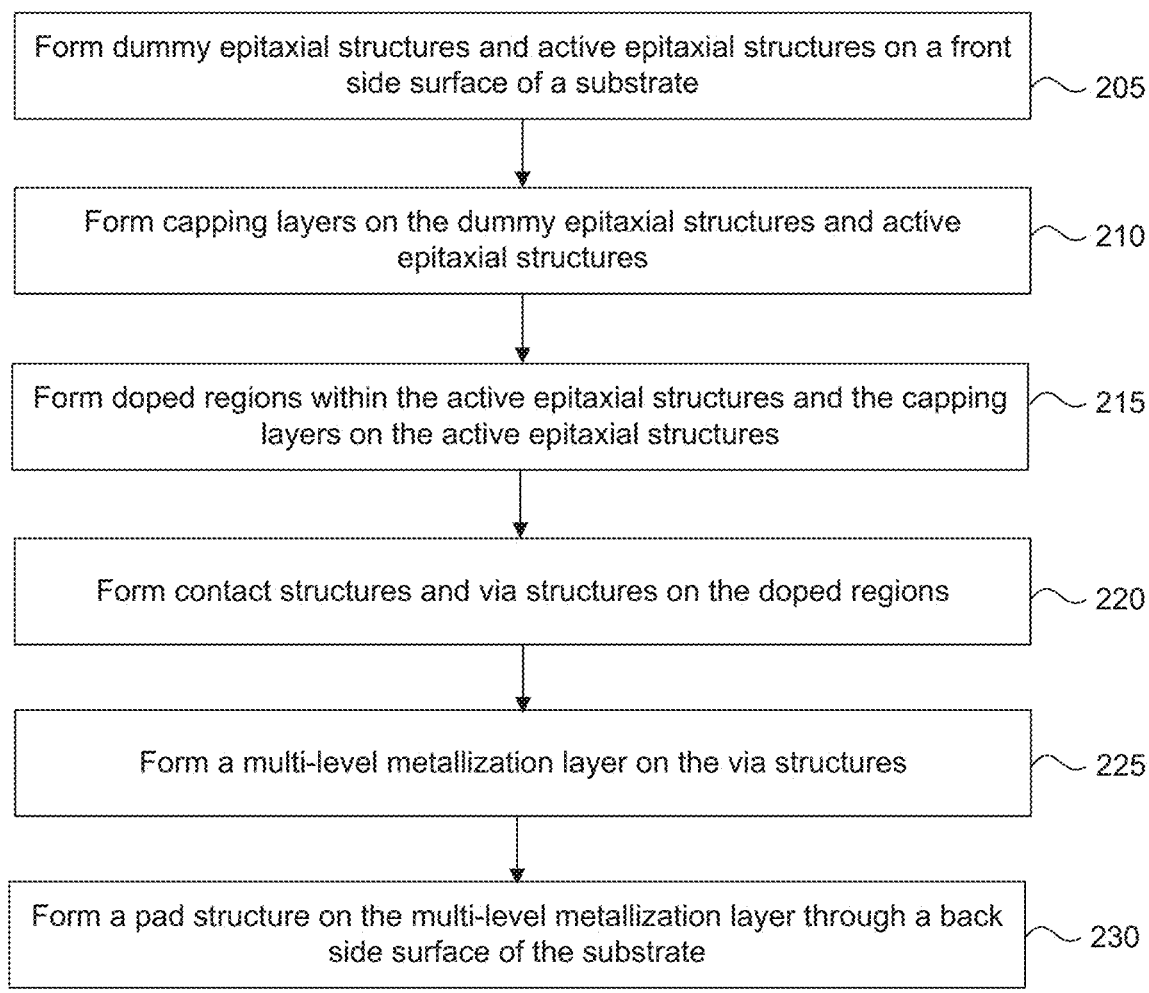
FIG. 2 is a flow diagram of a method for fabricating a BSI image sensor with active pixel structures and dummy pixel structures, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for semiconductor device 100 as illustrated in FIGS. 3-21. FIGS. 3-21 are cross-sectional views of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3-21 with the same annotations as elements in FIGS. 1A-1F are described above.

Figure 3:
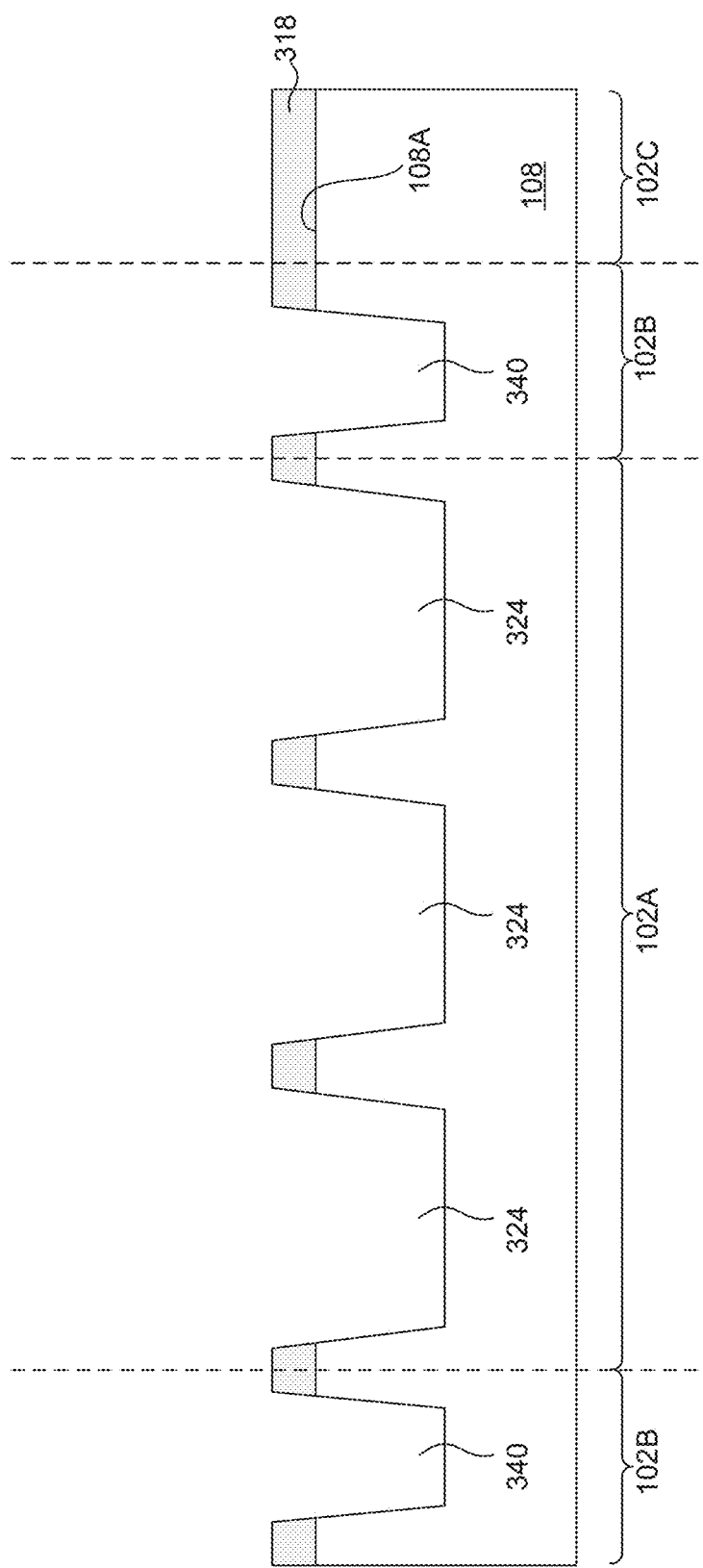
FIGS. 3-21 illustrate cross-sectional views of a BSI image sensor with active pixel structures and dummy pixel structures at various stages of its fabrication process, in accordance with some embodiments.
Figure 4:
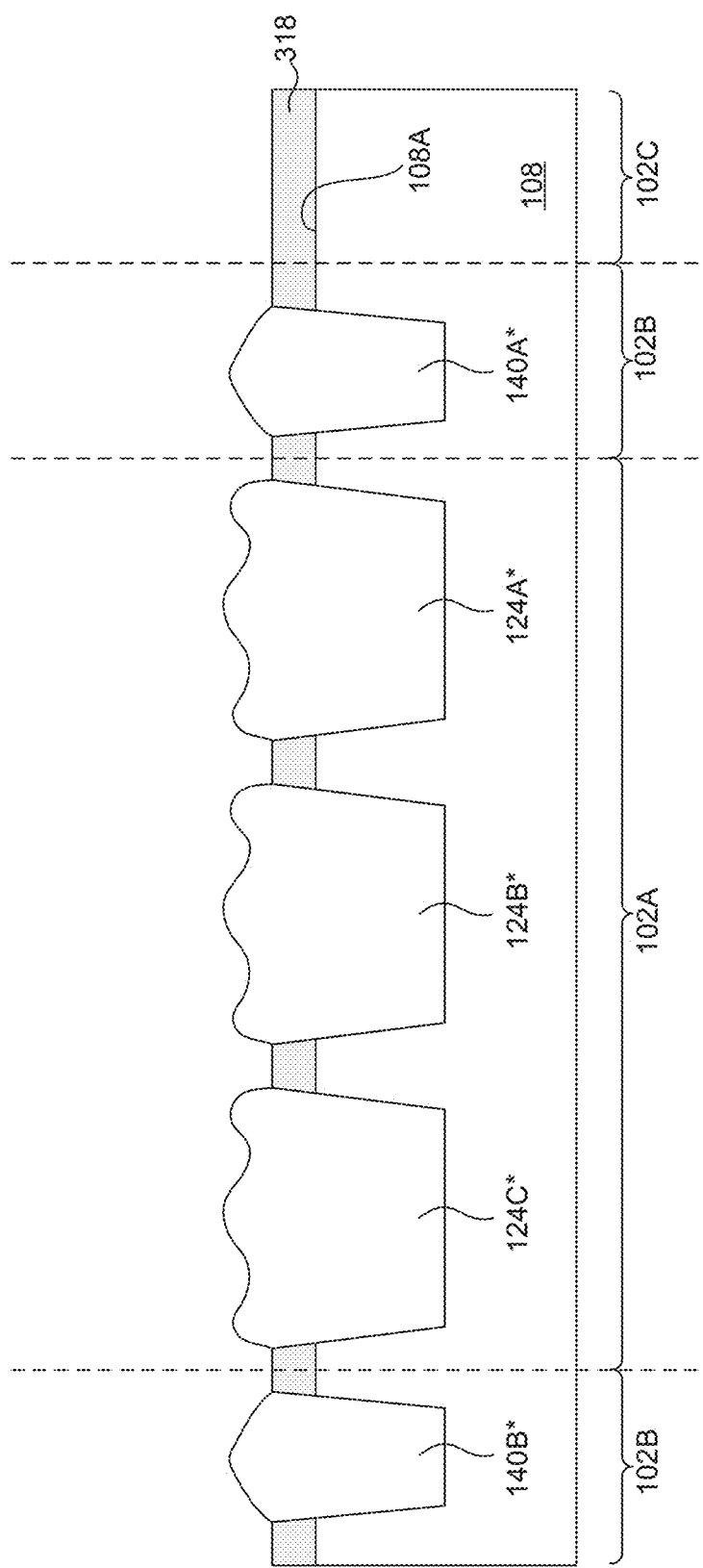
Figure 4:
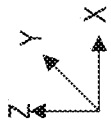
Figure 5:
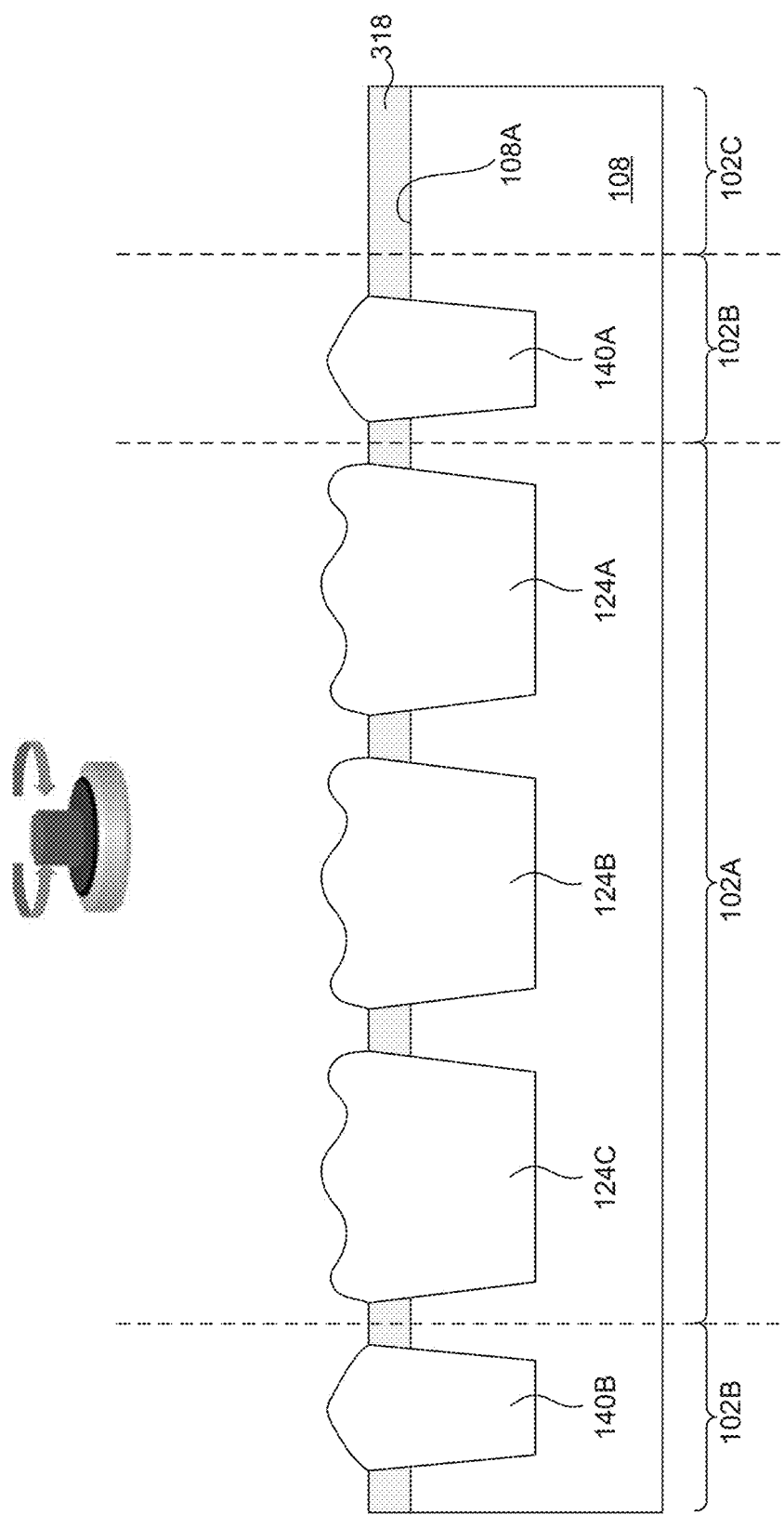
Figure 6:
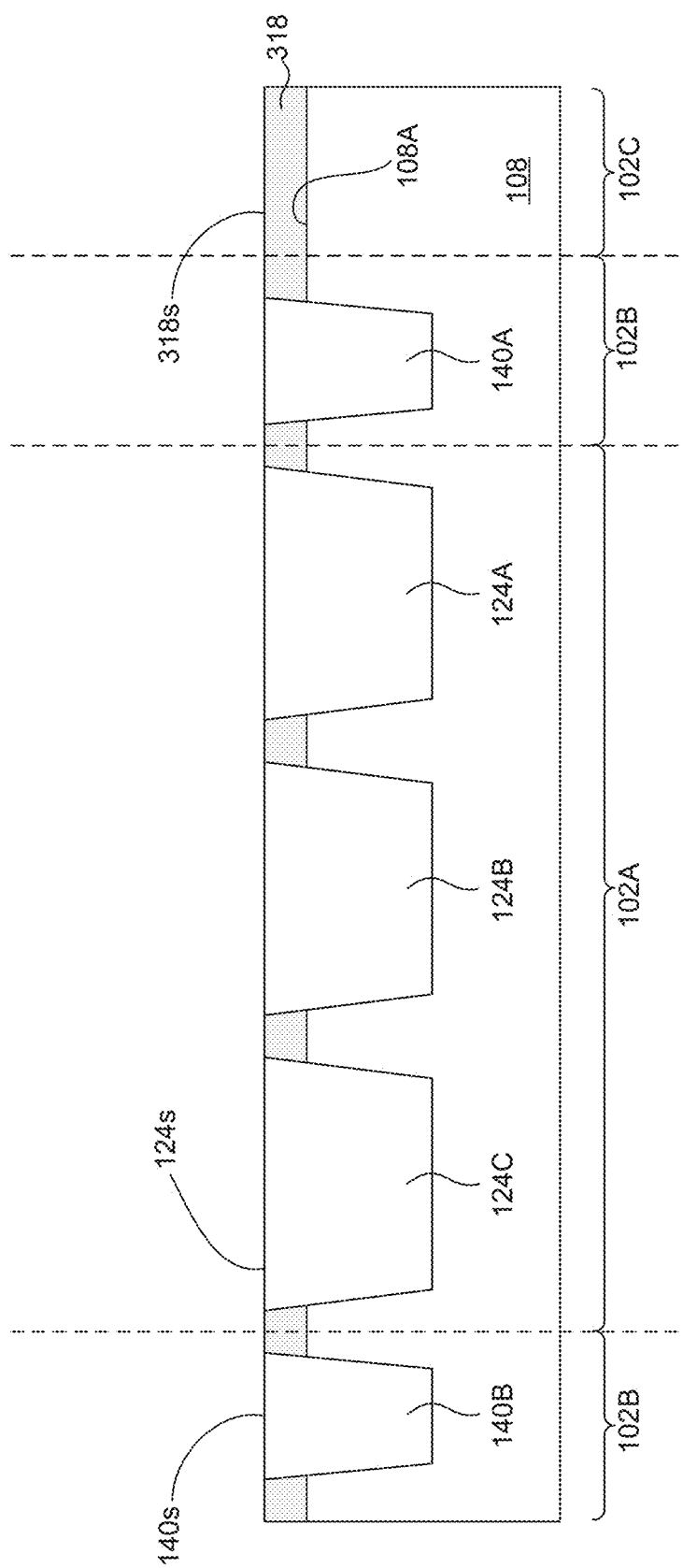

In operation 205, dummy epitaxial structures and active epitaxial structures are formed on a front side surface of a substrate. For example, as shown in FIGS. 3-6, dummy epitaxial structures 140A-140B and active epitaxial structures 124A-124C can be formed at the same time on front side surface 108A of substrate 108. The formation of dummy epitaxial structures 140A-140B and active epitaxial structures 124A-124C can include sequential operations of (i) forming trenches 324 and 340 at the same time in substrate 108 through a dielectric layer 318 disposed on front side surface 108A, as shown in FIG. 3, (ii) epitaxially growing, at the same time, dummy structures 140A*-140B* within respective trenches 340A-340B and active structures 124A*-124C* within respective trenches 324A-324C, as shown in FIG. 4, and (iii) performing a CMP process on the structure of FIG. 4, as shown in FIG. 5, to form dummy epitaxial structures 140A-140B within respective trenches 340A-340B and active epitaxial structures 124A-124C within respective trenches 324A-324C with top surfaces 124s, 140s, and 318s substantially coplanar with each other, as shown in FIG. 6.

The formation of trenches 324A-324C and 340A-340B can include a dry etching process with etchants, such as chlorine-based gas, helium, fluorine-based gas, argon, and a combination thereof. The epitaxial growth of dummy structures 140A*-140B* and active structures 124A*-124C* can include epitaxially growing monocrystalline or polycrystalline structures of a semiconductor material, such as Ge or SiGe. The CMP process can include using a CMP slurry with a higher removal selectivity for the material of dummy structures 140A*-140B* and active structures 124A*-124C* than for the material of dielectric layer 318. In some embodiments, the CMP slurry can have a removal selectivity that is about 20 times to about 200 times greater for the material of dummy structures 140A*-140B* and active structures 124A*-124C* than for the material of dielectric layer 318. The CMP slurry can include hydrogen peroxide, potassium peroxydisulfate. nitrogen-oxide-based compound, polyethylene glycol, abrasive particles, such as colloidal silica, fumed silica, and aluminum oxide, or a combination thereof.

The formation of dummy structures 140A*-140B* adjacent to active structures 124A*-124C* eliminates or minimizes the CMP process-related dishing effect in the subsequently formed active epitaxial structures 124A-124C, as shown in FIG. 6. In the absence of dummy structures 140A*-140B*, the CMP process-related dishing effect can occur during the CMP of active structures 124A*-124C* due to different polishing rates of the different materials of active structures 124A*-124C* and the adjacent regions of dielectric layer 318.

Figure 7:
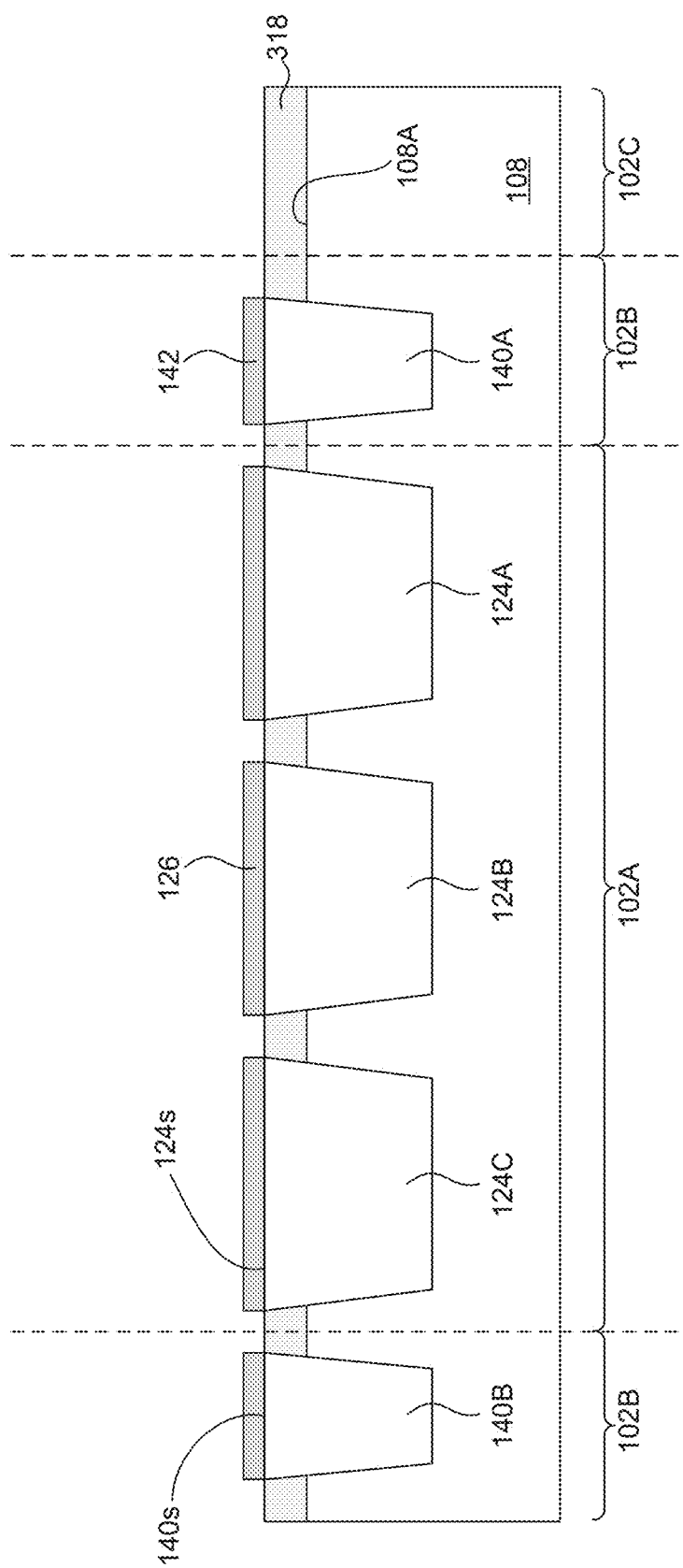

In operation 210, capping layers are formed on the dummy epitaxial structures and active epitaxial structures. For example, as shown in FIG. 7, capping layers 142 can be formed on dummy epitaxial structures 140A-140B and capping layers 126 are formed on active epitaxial structures 124A-124C at the same time. In some embodiments, the formation of capping layers 126 and 142 can include sequential operations of (i) depositing a Si, Ge, or SiGe layer on the structure of FIG. 6, and (ii) patterning the deposited Si, Ge, or SiGe layer to form the structure of FIG. 7. The deposition of Si, Ge, or SiGe layer can include using a silicon precursor (e.g., silane ($SiH_4$) or dichlorosilane (DCS)) and/or a germanium precursor (e.g., germane ($GeH_4$)) in a chemical vapor deposition (CVD) process or an atomic layer deposition (ALD) process. In some embodiments, the formation of capping layers 126 and 142 can include epitaxially growing the Si, Ge, or SiGe layer on top surfaces 124s and 140s at the same time.

Figure 8:
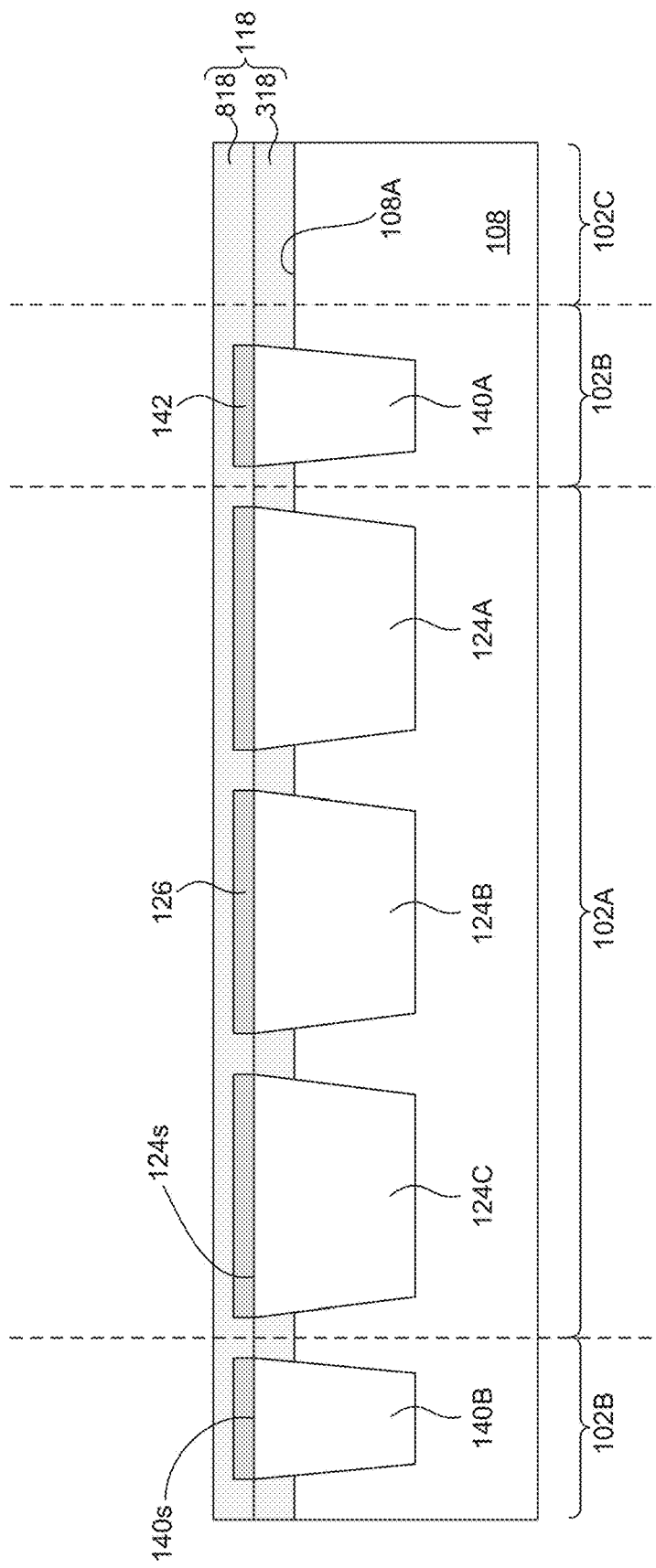

In some embodiments, following the formation of capping layers 126 and 142, a dielectric layer 818 with material similar to the material of dielectric layer 318 can be deposited on the structure of FIG. 7 to form the structure of FIG. 8. The formation of dielectric layer 818 can include using a CVD process, an ALD process, or a thermal oxidation process.

Figure 9:
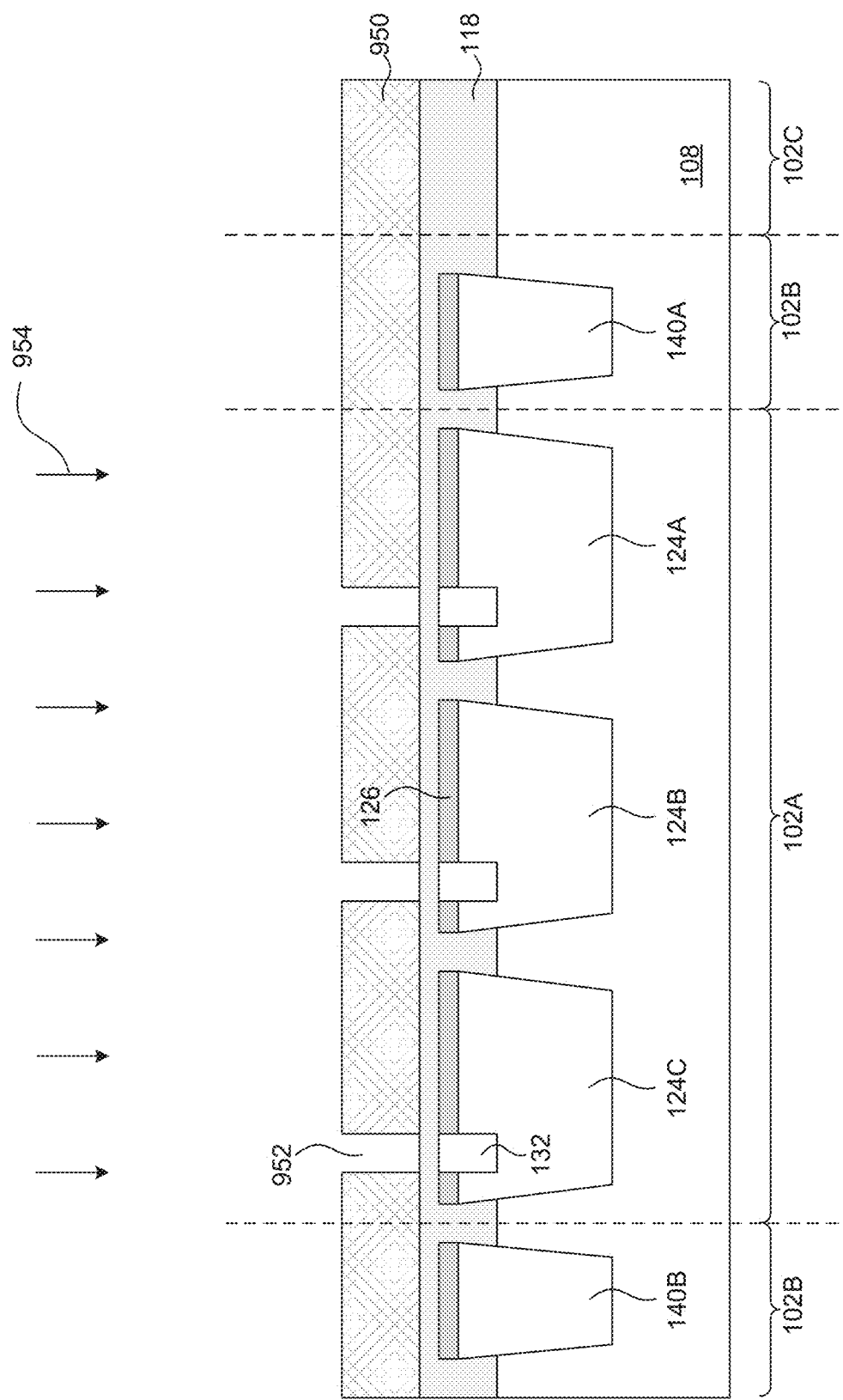
Figure 10:
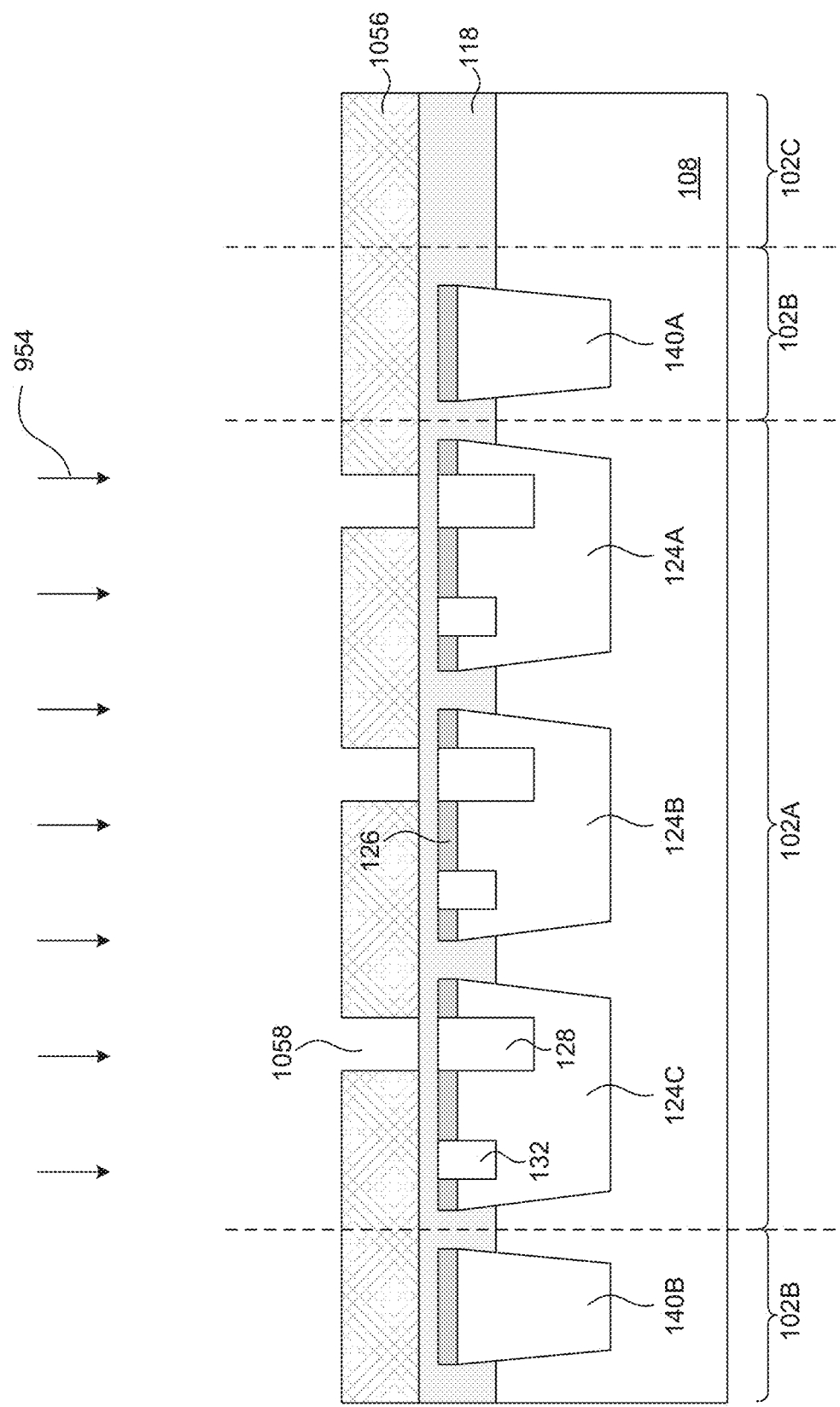
Figure 11:
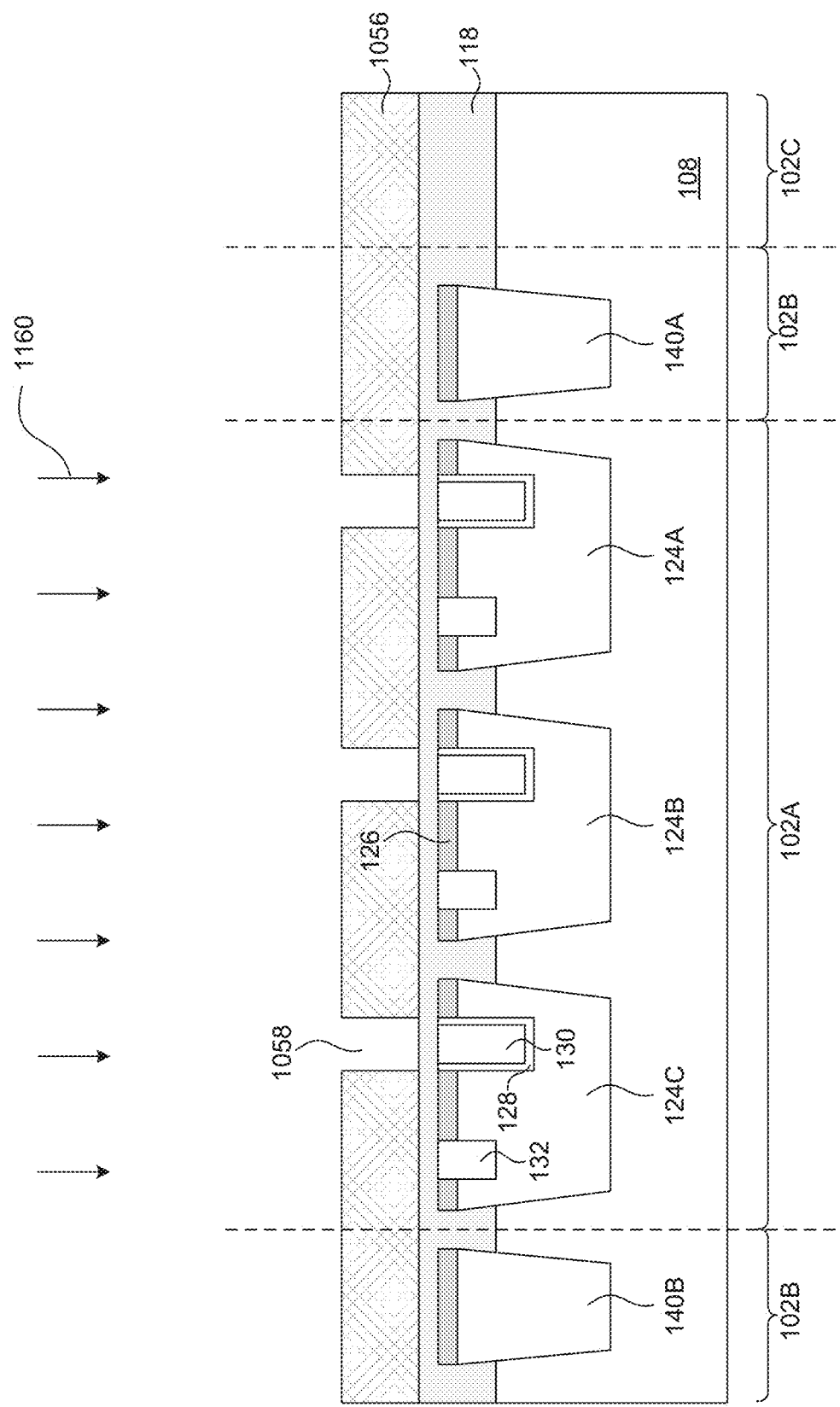
Figure 12:
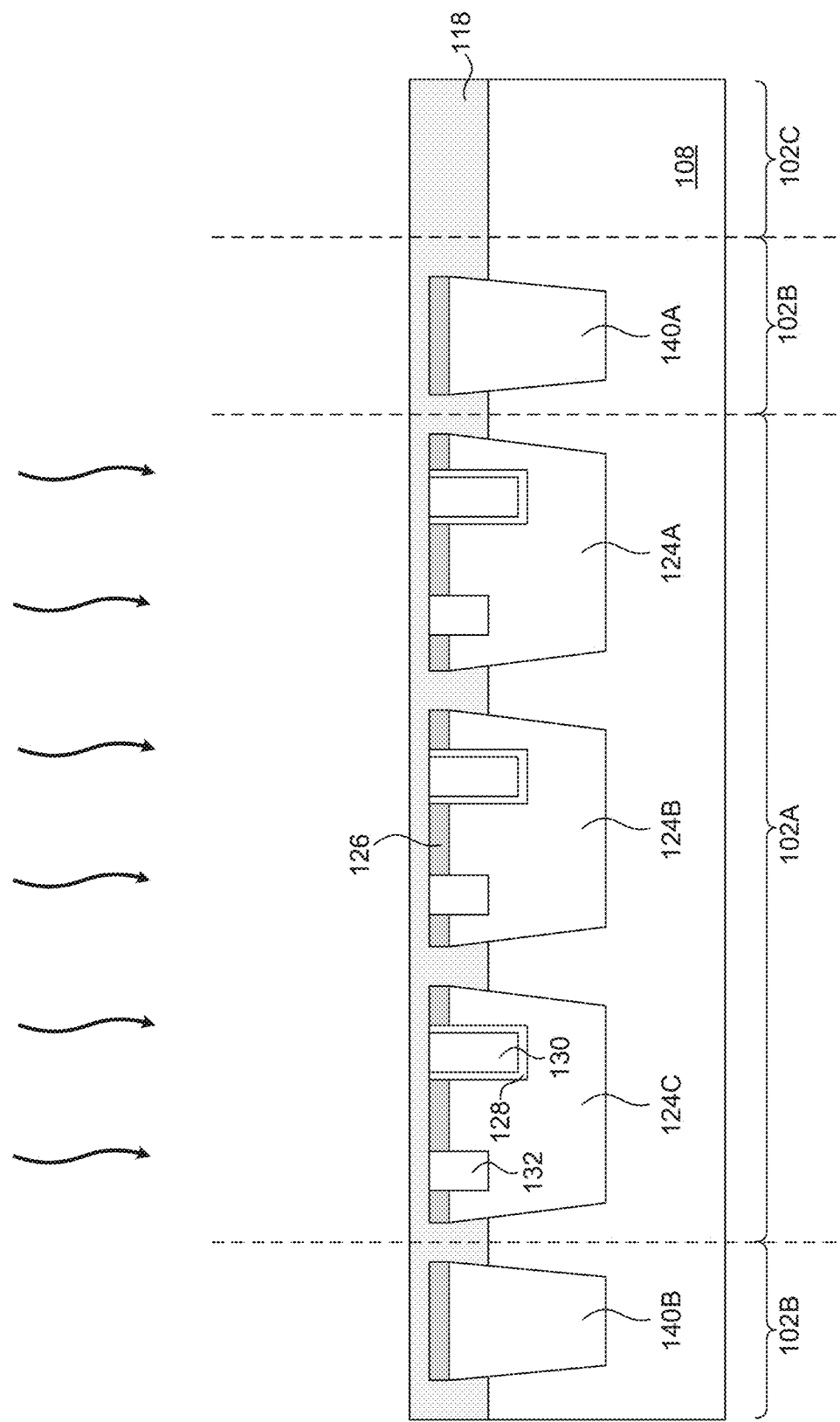

In operation 215, doped regions are formed within the active epitaxial structures. For example, as shown in FIGS. 9-12, P-type doped regions 130 and N-type doped regions 132 can be formed within capping layers 126 and active epitaxial structures 124A-124C. The formation of P-type doped regions 130 and N-type doped regions 132 can include sequential operations of (i) forming a patterned masking layer 950 with openings 952 on the structure of FIG. 8, as shown in FIG. 9, (ii) ion implanting n-type dopants 954 into capping layers 126 and active epitaxial structures 124A-124C through openings 952 to form doped regions 132, as shown in FIG. 9, (iii) removing patterned layer 950 (not shown), (iv) forming a patterned masking layer 1056 with openings 1058, as shown in FIG. 10, (v) ion implanting n-type dopants 954 into capping layers 126 and active epitaxial structures 124A-124C through openings 1058 to form N-well regions 128, as shown in FIG. 10, (vi) ion implanting p-type dopants 1160 into capping layers 126 and active epitaxial structures 124A-124C through openings 1058 to form p-type doped regions 130 within N-well regions 128, as shown in FIG. 11, and (vii) performing an annealing process on the structure of FIG. 11 after removing patterned layer 1056 to activate the dopants in doped regions 130-132, as shown in FIG. 12.

Figure 13:
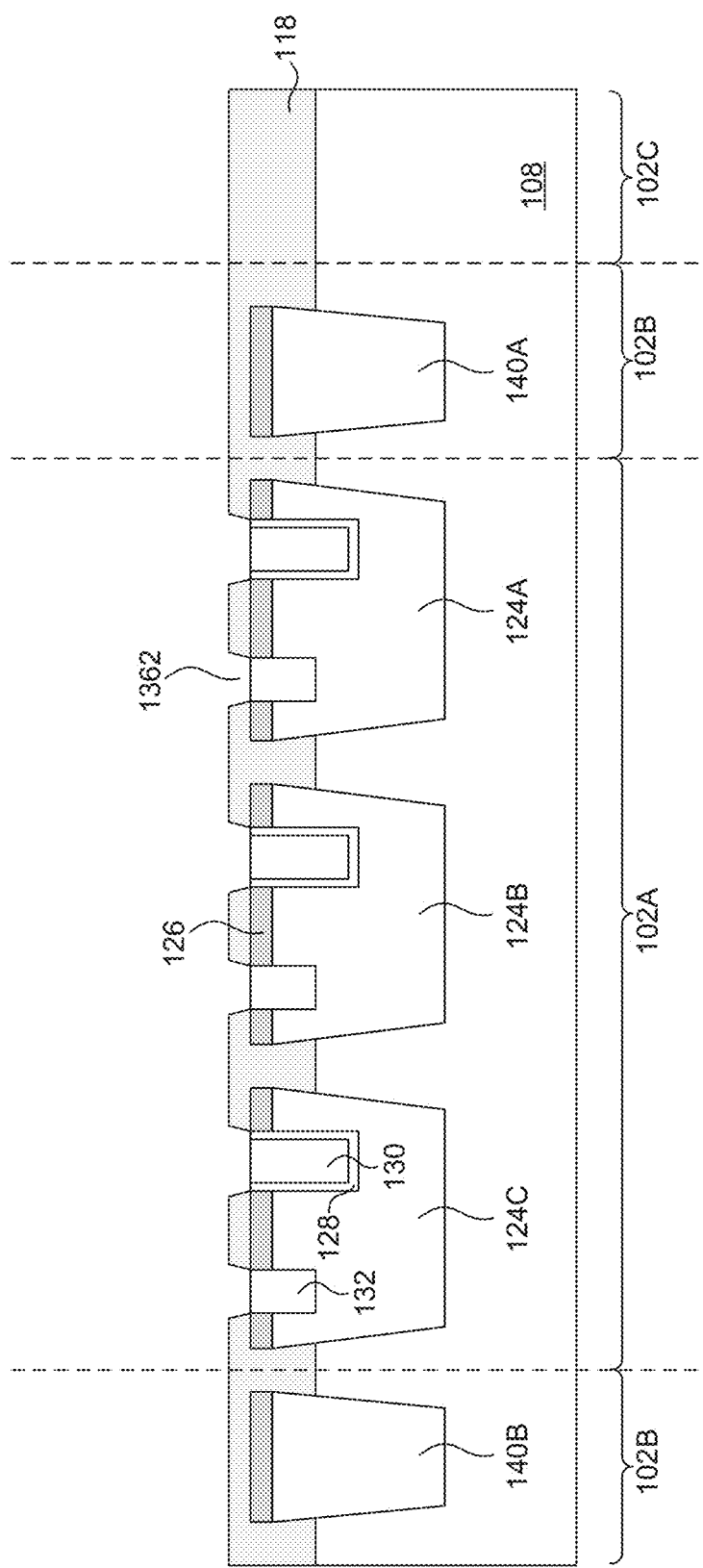
Figure 15:
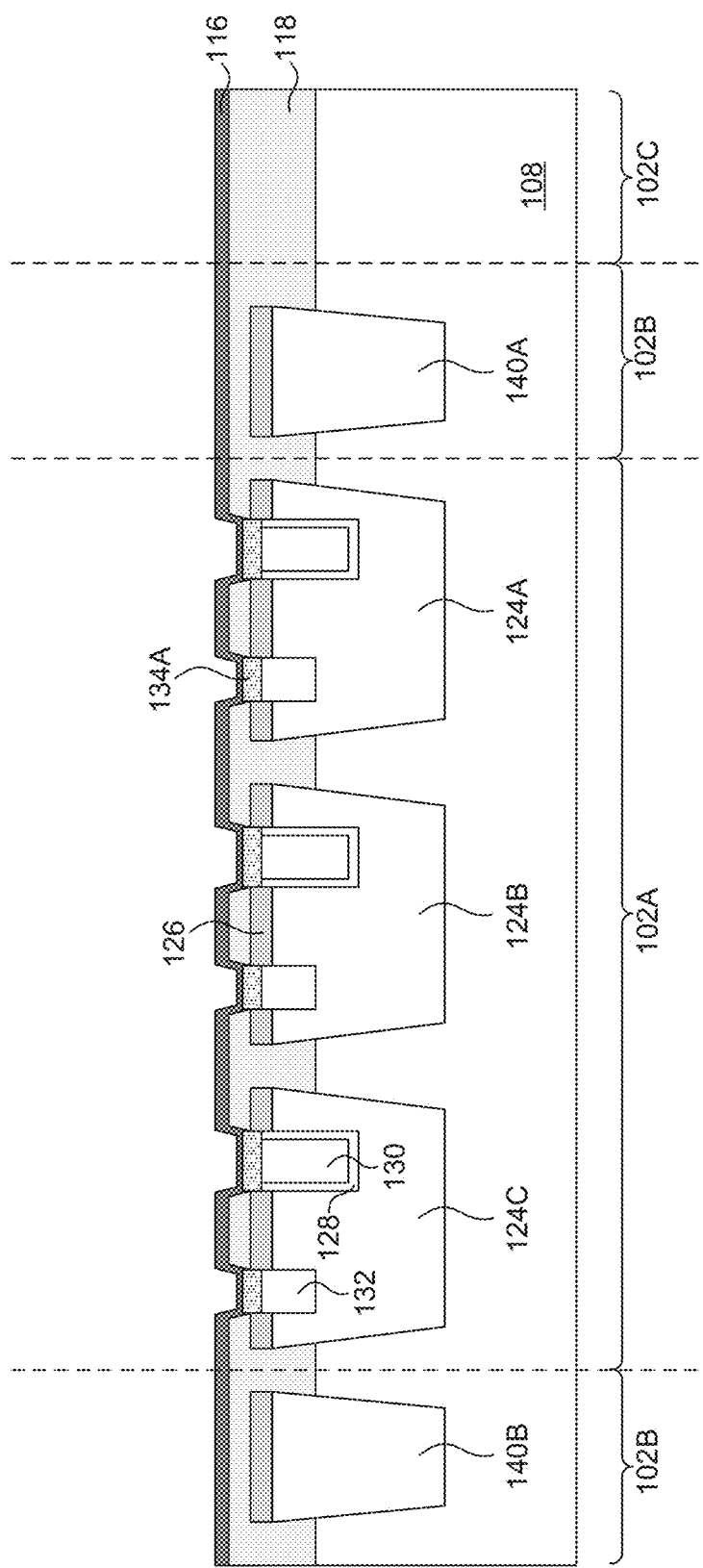
Figure 16:
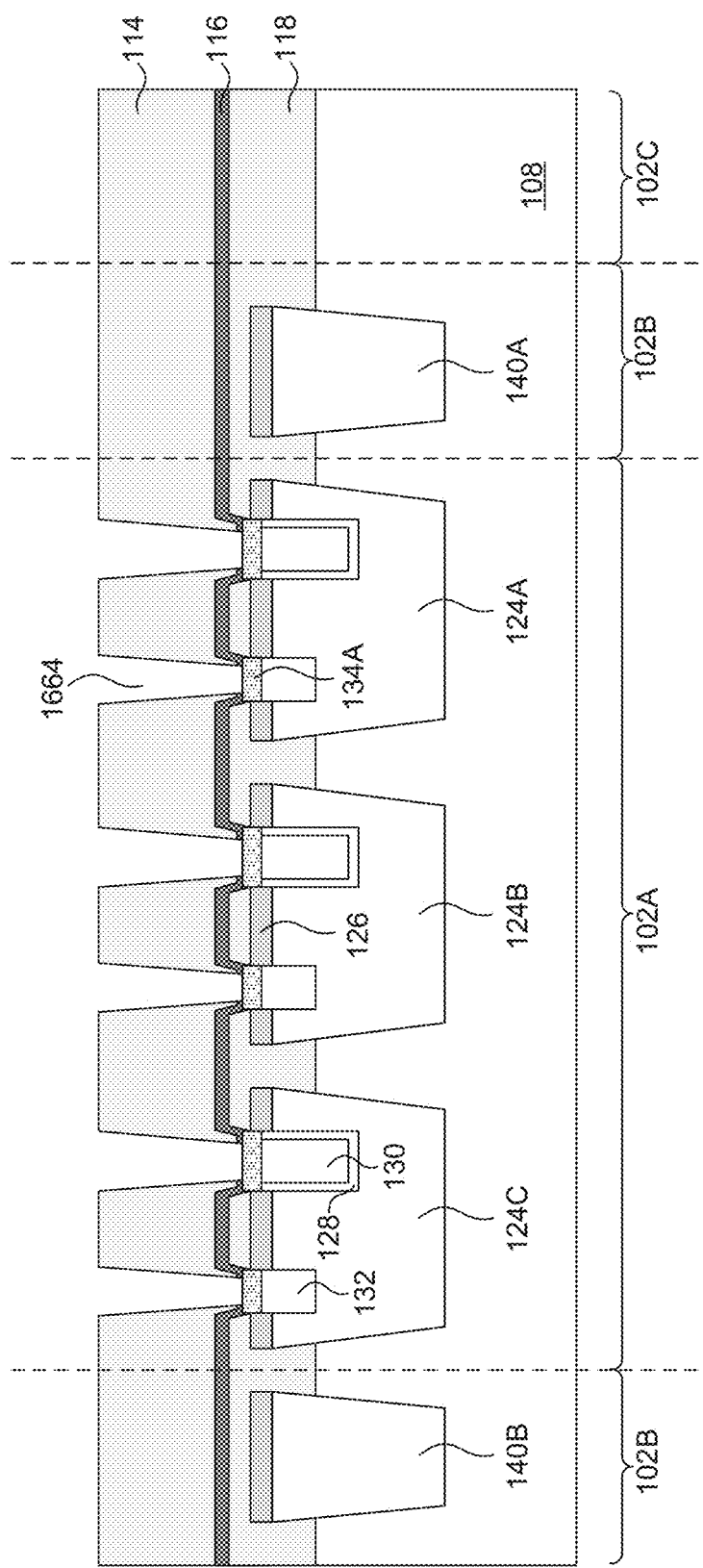
Figure 17:
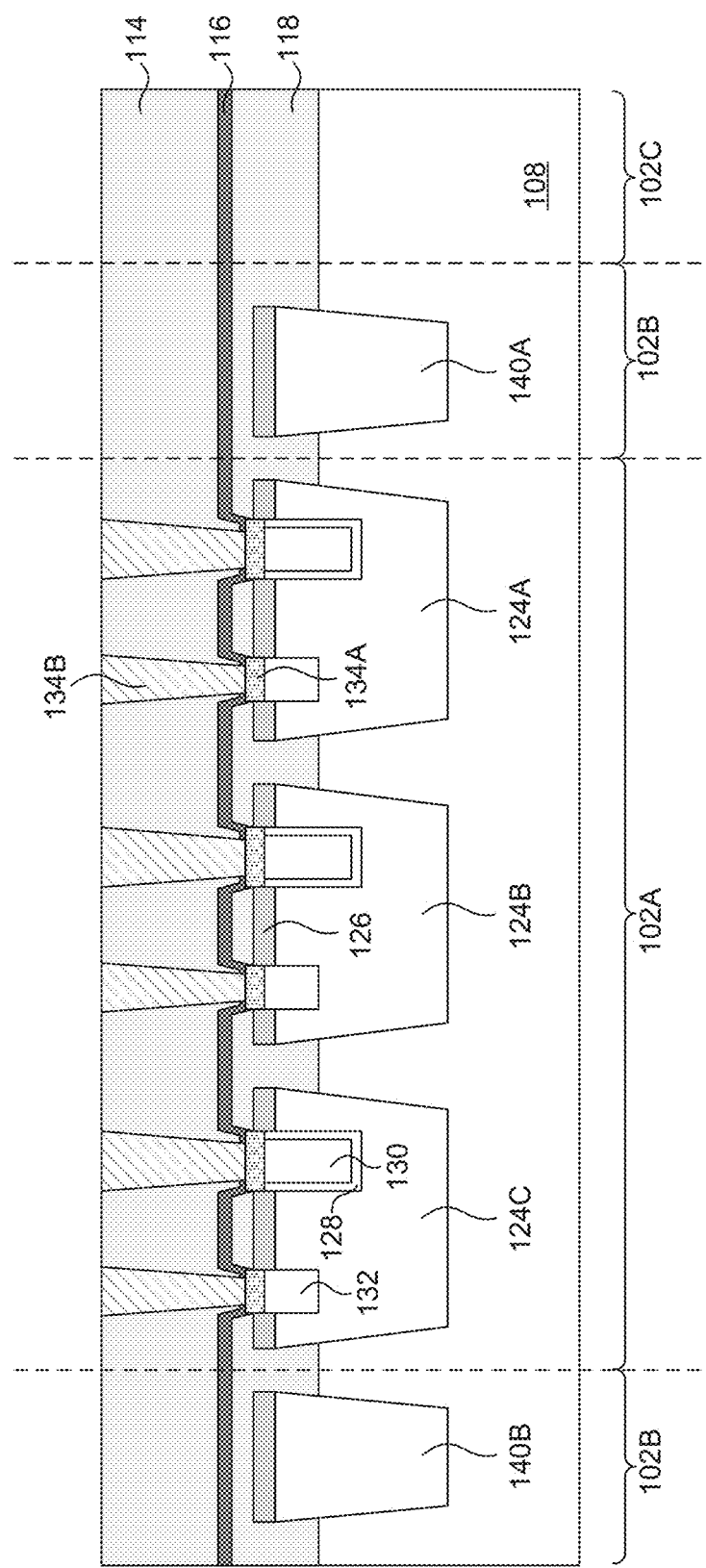
Figure 18:
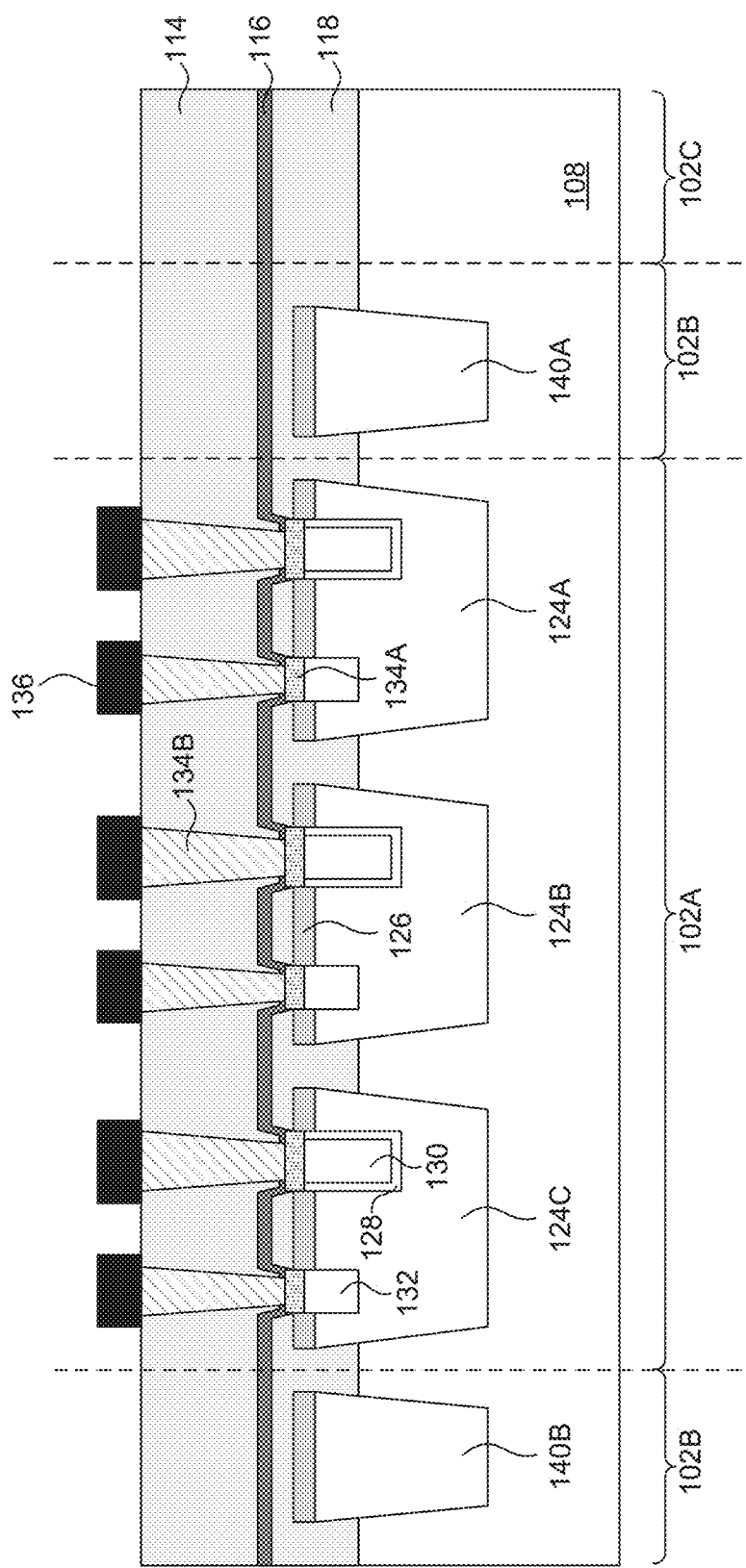

In operation 220, contact structures and via structures are formed on the doped regions. For example, as shown in FIGS. 13-18, contact structures 134 with silicide layers 134A and contact plugs 134B can be formed on doped regions 130-132 and via structures 136 are formed on contact structures 134. The formation of contact structures 134 can include sequential operations of (i) forming silicide openings 1362 on doped regions 130-132, as shown in FIG. 13, (ii) forming silicide layers 134A on doped regions 130-132, as shown FIG. 14, (iii) depositing ESL 116 on the structure of FIG. 14, as shown in FIG. 15, (iv) depositing ILD layer 114 on the structure of FIG. 15, as shown in FIG. 16, (v) forming contact openings 1664 within ILD layer 114 and ESL 116 to expose portions of silicide layers 134A, as shown in FIG. 16, and (vi), forming contact plugs 134B within contact openings 1664, as shown in FIG. 17.

Figure 14:
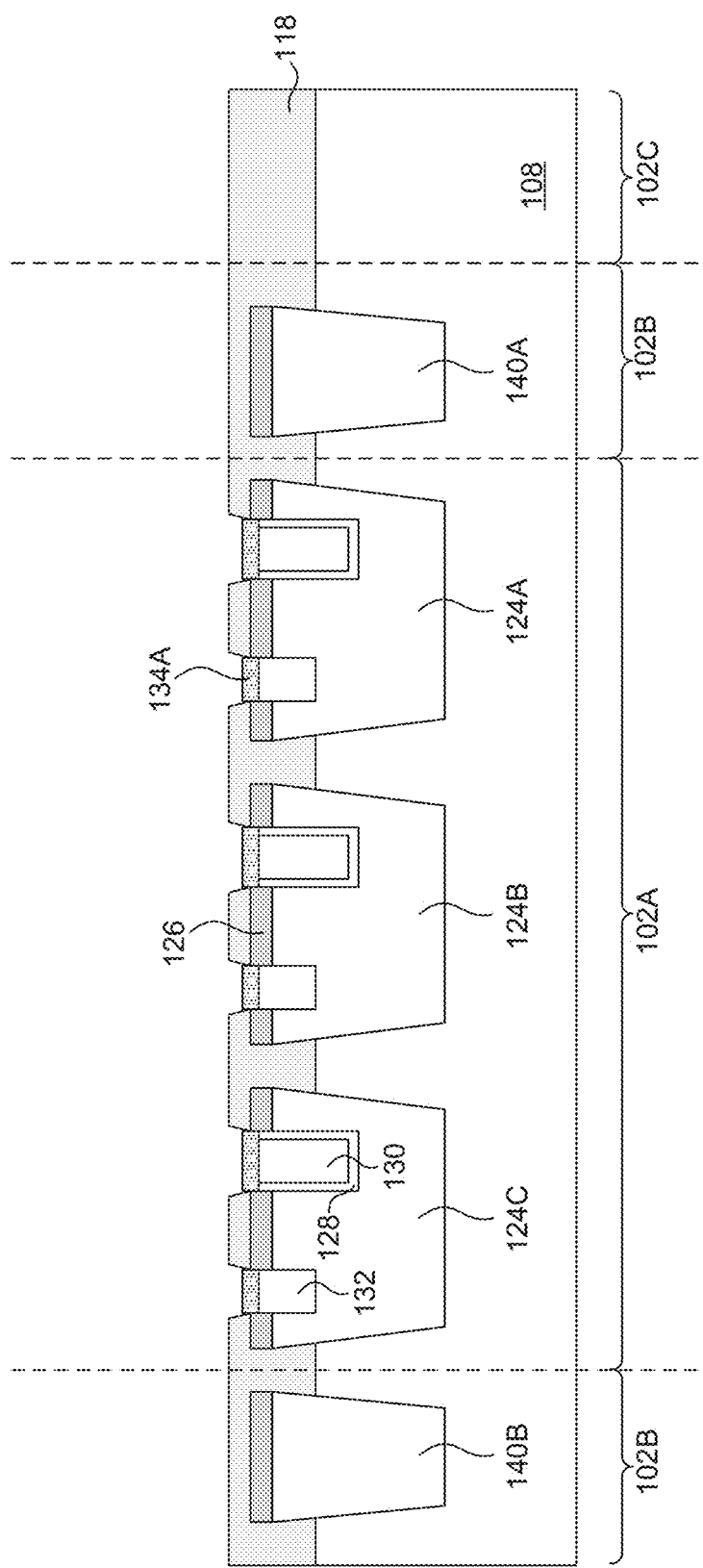
Figure 19:
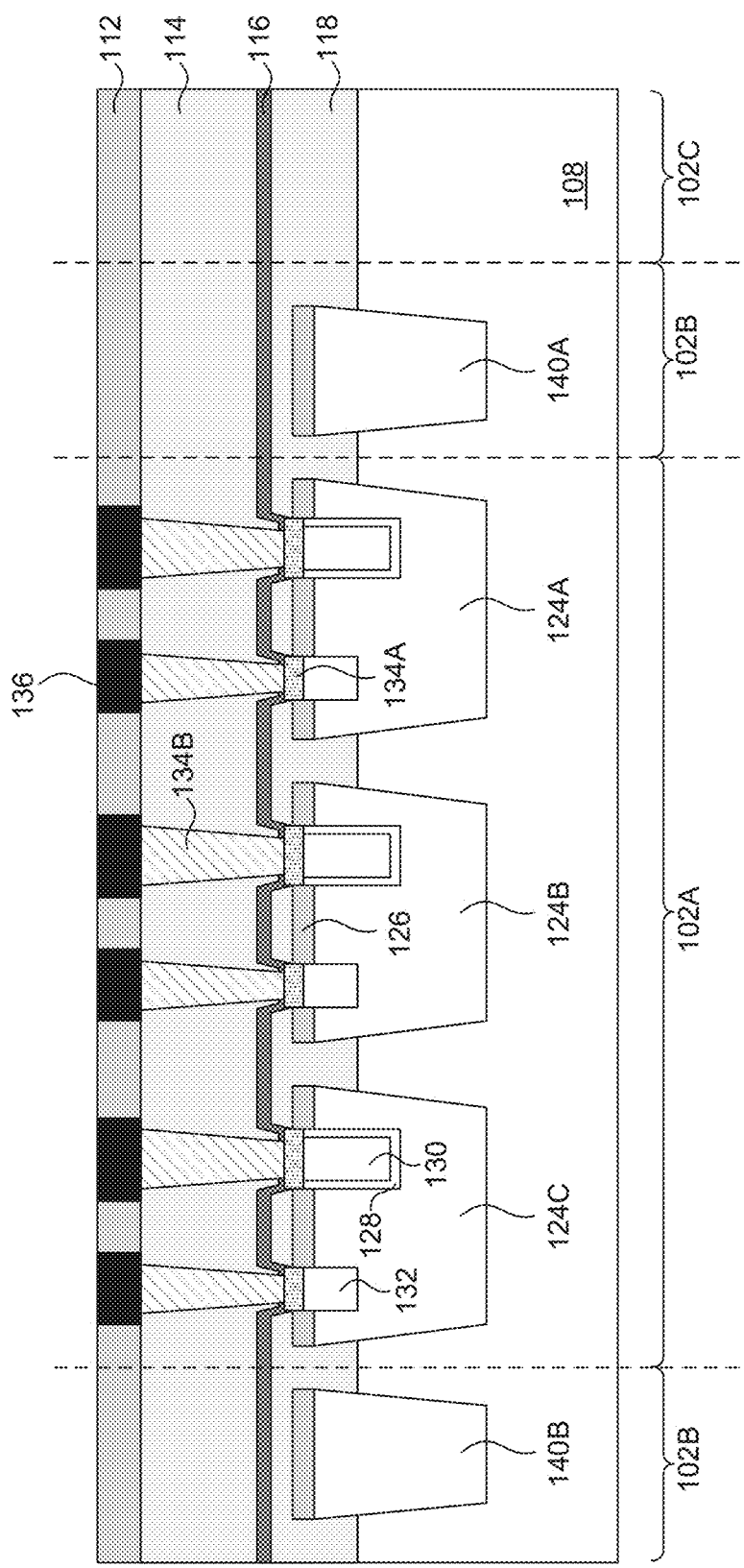

The formation of silicide layers 134A can include sequential operations of (i) depositing a metal layer (not shown) on the structure of FIG. 13, (ii) performing an annealing process on the structure with the metal layer, and (iii) removing the non-reacted portions of the metal layer on dielectric layer 118 to form the structure of FIG. 14. The formation of via structures 136 can include sequential operations of (i) depositing a metal layer (not shown) on the structure of FIG. 17, and (ii) patterning the metal layer to form the structure of FIG. 18. Following the formation of via structures 136, an insulating layer (e.g., a nitride layer, an oxide layer, an oxynitride layer, a polymer layer, or a combination thereof; not shown) can be deposited on the structure of FIG. 18, and subsequently polished using a CMP process to form passivation layer 112, as shown in FIG. 19.

Figure 20:
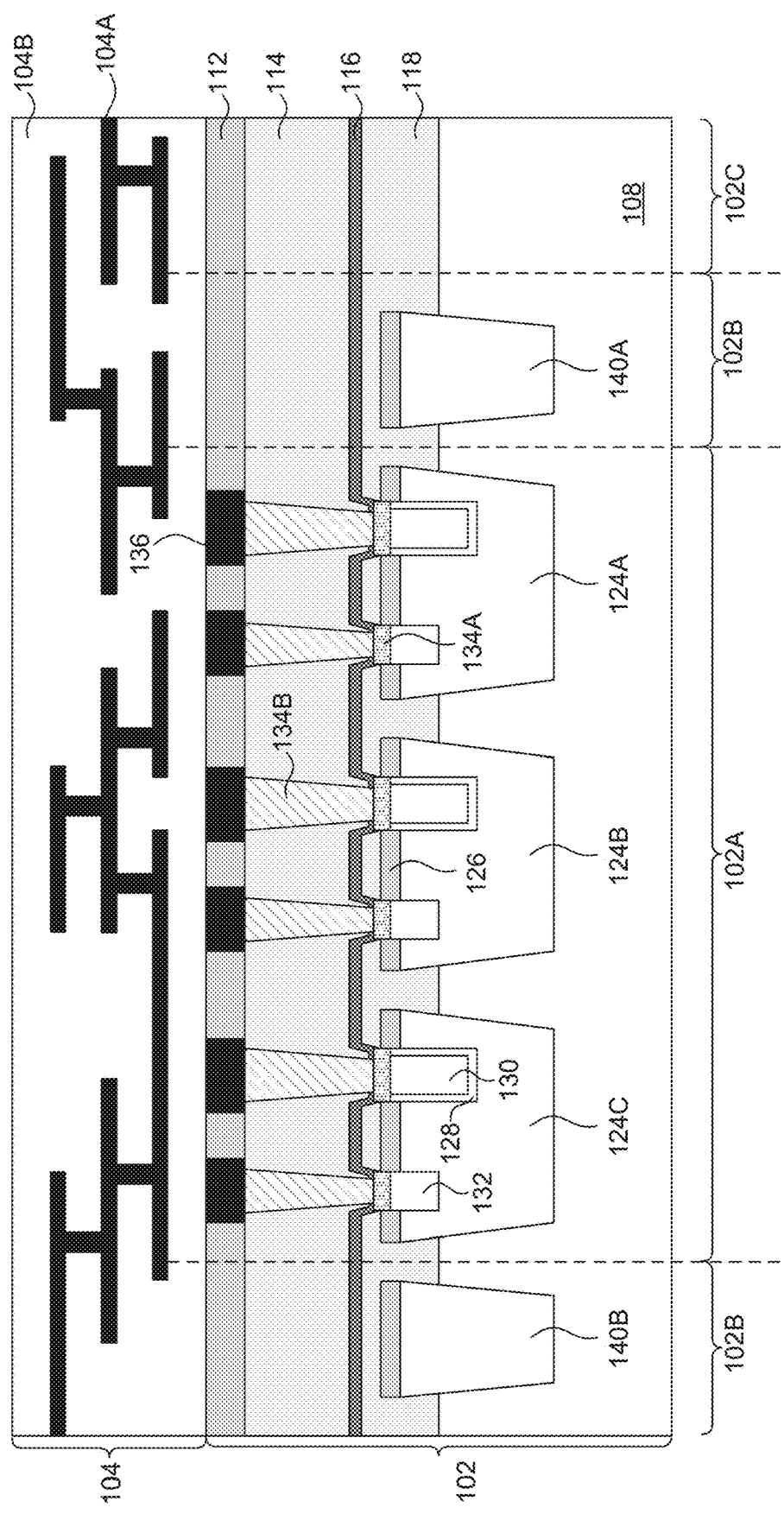
Figure 21:
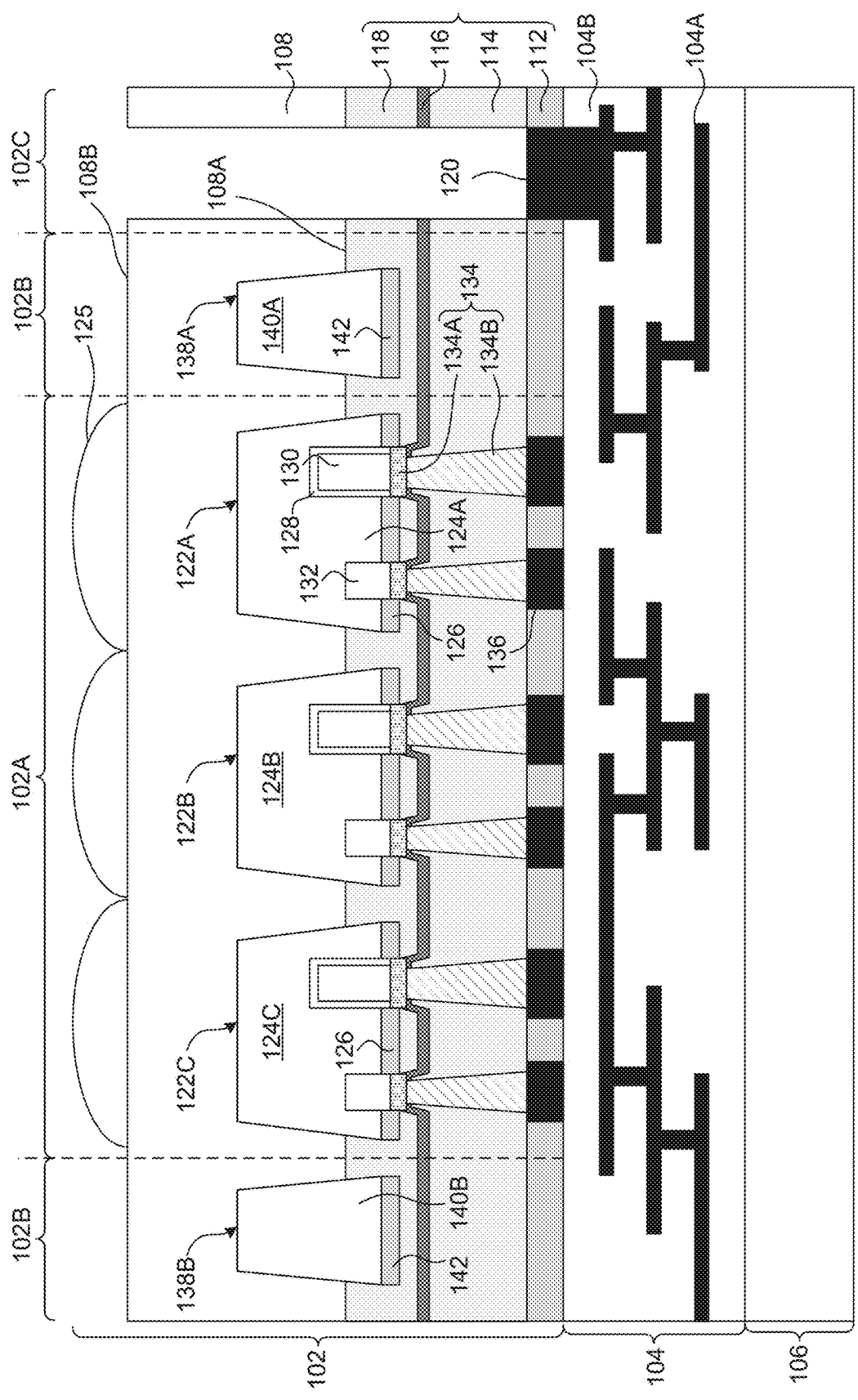

In operation 225, a multi-level metallization layer is formed on the via structures. For example, as shown in FIG. 20, multi-level metallization layer 104 with multi-level interconnect structure 104A embedded within IMD layer 104B can be formed on via structures 136 and passivation layer 112. The formation of multi-level metallization layer 104 can be followed by bonding carrier substrate 106 to multi-level metallization layer 104, as shown in FIG. 21.

In operation 230, a pad structure is formed on the multi-level metallization layer through a back side surface of the substrate. For example, as shown in FIG. 21, pad structure 120 can be formed on multi-level interconnect structure 104A through back side surface 108B. The formation of pad structure 120 can include sequential operations of (i) forming a pad opening (not shown) within substrate 108, dielectric layer 118, ESL 116, ILD layer 114, passivation layer 112, and a portion of IMD layer 104B, (ii) depositing a conductive layer (not shown) within the pad opening, and (iii) patterning and etching the conductive layer to form pad structure 120 within pad opening, as shown in FIG. 21. Following the formation of pad structure 120, an array of microlens 125 can be formed on back side surface 108B.

The present disclosure provides example BSI image sensors (e.g., BSI image sensor 102) with dummy pixel structures (e.g., dummy pixel structures 138A-138B) and active pixel structures (e.g., active pixel structures 122A-122C), and example methods (e.g., method 200) for fabricating the same. In some embodiments, the dummy pixel structures are disposed in a dummy pixel region (e.g., dummy pixel region 102B) surrounding an array of active pixel structures. The dummy and active pixel structures include similar epitaxial structures (also referred to as "dummy epitaxial structures" and "active epitaxial structures") and are formed at the same time. In some embodiments, the dummy epitaxial structures (e.g., dummy epitaxial structures 140A-140B) are arranged to cover about 10% to about 100% (e.g., about 20%, about 50%, about 80%, or about 100%) of the dummy pixel region surrounding the outermost active epitaxial structures (e.g., active epitaxial structures 124A and 124C). In addition, the dummy epitaxial structures have top surface areas that are about 50% to about 120% of the top surface areas of the outermost active epitaxial structures.

The placement of the dummy epitaxial structures adjacent to the outermost active epitaxial structures and the formation of the epitaxial structures at the same time eliminates or minimizes the CMP process-related dishing effect in the outermost active epitaxial structures. In some embodiments, with the use of the dummy epitaxial structures, the top surfaces (e.g., top surfaces 124s) of the outermost active epitaxial structures can have a surface roughness less than about 10 nm (e.g., about 2 nm, about 5 nm, or about 8 nm) and can have concave shaped recesses with recess depths less than about 5 nm (e.g., 0.1 nm, 0.5 nm, 1 nm, or 2 nm). In some embodiments, the top surfaces of the outermost active epitaxial structures can have a substantially uniform surface without any concave shaped recesses (e.g., as shown in FIG. 1A). Thus, the use of dummy epitaxial structures improves the uniformity of the top surfaces of the outermost active epitaxial structures by about 50% to about 100% compared to the top surfaces of the active epitaxial structures that are not surrounded by dummy epitaxial structures.

The improved uniformity of the top surfaces consequently improves the interfaces between the outermost active epitaxial structures and corresponding capping layers (e.g., capping layers 126) disposed on the active epitaxial structures. As a result, the generation of dark currents due to non-uniform interfaces between the outermost active epitaxial structures and corresponding capping layers is minimized or eliminated, and consequently, the sensor performance of BSI image sensors is improved by about 40% to about 60% compared to BSI image sensors without the dummy pixel structures described herein.

In some embodiments, a semiconductor device includes a substrate with a first surface and a second surface opposite to the first surface, a first pixel region with a first pixel structure disposed on the first surface of the substrate, a second pixel region, surrounding the first pixel region, includes a second pixel structure adjacent to the first pixel structure and electrically isolated from the first pixel structure, and a contact pad region with a pad structure disposed adjacent to the second pixel region. The first pixel structure includes a first epitaxial structure disposed within the substrate and a first capping layer disposed on the first epitaxial structure and the first epitaxial structure has a first top surface. The second pixel structure includes a second epitaxial structure disposed within the substrate and a second capping layer disposed on the second epitaxial structure. The second epitaxial structure has a second top surface that is substantially coplanar with the first top surface. The first and second epitaxial structures include a same semiconductor material.

In some embodiments, an image sensor includes a substrate with a front side surface and a back side surface opposite to the front side surface, an array of active epitaxial structures disposed on the front side surface of the substrate, an active capping layer disposed on each of the active epitaxial structures, a plurality of dummy epitaxial structures, surrounding the array of active epitaxial structures, disposed on the front side surface of the substrate, a dummy capping layer disposed on each of the dummy epitaxial structures, and an array of microlens disposed on the back side surface of the substrate. Top surfaces of the active and dummy epitaxial structures are substantially coplanar with each other. The active and dummy epitaxial structures include a same semiconductor material.

In some embodiments, a method includes depositing a first dielectric layer on a substrate, forming a dummy epitaxial structure and an active epitaxial structure within the dielectric layer and the substrate, forming first and second capping layers on the dummy and active epitaxial structures, respectively, selectively doping regions of the active epitaxial structure and the second capping layer, selectively forming a silicide layer on the doped regions, depositing an etch stop layer on the silicide layer, and forming conductive plugs on the silicide layer through the etch stop layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate with a first surface and a second surface opposite to the first surface;
    a first pixel region with a first pixel structure disposed on the first surface of the substrate,
        wherein the first pixel structure comprises a first epitaxial structure disposed within the substrate and a first capping layer disposed on the first epitaxial structure, and
        wherein the first epitaxial structure has a first top surface;
    a second pixel region, surrounding the first pixel region, comprising a second pixel structure adjacent to the first pixel structure and electrically isolated from the first pixel structure,
        wherein the second pixel structure comprises a second epitaxial structure disposed within the substrate and a second capping layer disposed on the second epitaxial structure,
        wherein the second epitaxial structure has a second top surface that is substantially coplanar with the first top surface, and
        wherein the first and second epitaxial structures comprise a same semiconductor material; and
    a contact pad region with a pad structure disposed adjacent to the second pixel region.

2. The semiconductor device of claim 1, wherein a ratio between a surface area of the first top surface and a surface area of the second top surface ranges from about 2:1 to about 1:2.

3. The semiconductor device of claim 1, wherein a ratio between adjacent sides of the first and second top surfaces ranges from about 2:1 to about 1:2.

4. The semiconductor device of claim 1, wherein the second epitaxial structure comprises an array of epitaxial structures surrounding the first epitaxial structure.

5. The semiconductor device of claim 1, wherein a distance between the first and second top surfaces ranges from about 200 nm to about 1000 nm.

6. The semiconductor device of claim 1, wherein vertical dimensions of the first and second epitaxial structures are substantially equal to each other.

7. The semiconductor device of claim 1, wherein the first and second epitaxial structures comprise germanium or silicon germanium.

8. The semiconductor device of claim 1, wherein top surfaces of the first and second capping layers are substantially coplanar with each other.

9. The semiconductor device of claim 1, wherein the first and second capping layers comprise a same semiconductor material.

10. The semiconductor device of claim 1, wherein the first and second capping layers comprise an other semiconductor material that is different from the semiconductor materials of the first and second epitaxial structures.

11. An image sensor, comprising:
   a substrate with a front side surface and a back side surface opposite to the front side surface;
   an array of active epitaxial structures disposed on the front side surface of the substrate;
   an active capping layer disposed on each of the active epitaxial structures;
   a plurality of dummy epitaxial structures, surrounding the array of active epitaxial structures, disposed on the front side surface of the substrate;
   a dummy capping layer disposed on each of the dummy epitaxial structures,
      wherein top surfaces of the active and dummy epitaxial structures are substantially coplanar with each other, and
      wherein the active and dummy epitaxial structures comprise a same semiconductor material; and
   an array of microlens disposed on the back side surface of the substrate.

12. The image sensor of claim 11, wherein an outermost row of the array of active epitaxial structures is adjacent to an array of dummy epitaxial structures of the plurality of dummy epitaxial structures.

13. The image sensor of claim 11, wherein an active epitaxial structure in the array of active epitaxial structures has a first top surface and a dummy epitaxial structure of the plurality of dummy epitaxial structures has a second top surface, and
   wherein a ratio of a surface area of the first top surface to a surface area of the second top surface ranges from about 2:1 to 1:2.

14. The image sensor of claim 11, wherein a distance between an outermost row of the array of active epitaxial structures and an array of dummy epitaxial structures of the plurality of dummy epitaxial structures adjacent to the outermost row ranges from about 200 nm to about 1000 nm.

15. A semiconductor device, comprising:
   a dielectric layer disposed on a substrate;
   a dummy epitaxial structure and an active epitaxial structure disposed in the dielectric layer and the substrate;
   first and second capping layers disposed on the dummy and active epitaxial structures, respectively;
   doped regions disposed in the active epitaxial structure and the second capping layer;
   a silicide layer disposed on the doped regions;
   an etch stop layer disposed on the silicide layer; and
   conductive plugs disposed on the silicide layer through the etch stop layer.

16. The semiconductor device of claim 15, wherein the dummy and active epitaxial structures comprise a same semiconductor material.

17. The semiconductor device of claim 15, wherein the dummy epitaxial structure comprises a top surface area that is equal to or greater than about half of a top surface area of the active epitaxial structure.

18. The semiconductor device of claim 15, wherein the dummy epitaxial structure comprises a top surface area that is equal to or less than about two times of a top surface area of the active epitaxial structure.

19. The semiconductor device of claim 15, wherein the dummy epitaxial structure is separated from the active epitaxial structure by a distance of about 200 nm to about 1000 nm.

20. The semiconductor device of claim 15, wherein the dummy epitaxial structure comprises an array of epitaxial structures surrounding the active epitaxial structure.

* * * * *